(12) United States Patent
Yang

(10) Patent No.: US 12,374,579 B1
(45) Date of Patent: Jul. 29, 2025

(54) SEMICONDUCTOR PROCESSING EQUIPMENT

(71) Applicant: Suzhou Zhicheng Semiconductor Technology Co., Ltd., Jiangsu (CN)

(72) Inventor: Shipin Yang, Jiangsu (CN)

(73) Assignee: Suzhou Zhicheng Semiconductor Technology Co., Ltd., Kunshan (CN)

( * ) Notice: Subject to any disclaimer, the term of this patent is extended or adjusted under 35 U.S.C. 154(b) by 0 days.

(21) Appl. No.: 19/002,629

(22) Filed: Dec. 26, 2024

(30) Foreign Application Priority Data

Mar. 8, 2024 (CN) .......................... 202410263804.4

(51) Int. Cl.
*H01L 21/687* (2006.01)
*H01L 21/67* (2006.01)

(52) U.S. Cl.
CPC .. *H01L 21/68785* (2013.01); *H01L 21/67017* (2013.01); *H01L 21/68728* (2013.01); *H01L 21/68742* (2013.01)

(58) Field of Classification Search
CPC ......... H01L 21/68785; H01L 21/67017; H01L 21/68728; H01L 21/68742
See application file for complete search history.

(56) References Cited

U.S. PATENT DOCUMENTS

| 11,955,365 | B2 * | 4/2024 | Ikeda | H01L 21/30604 |
| 2005/0076531 | A1 * | 4/2005 | Smith | H01L 21/68728 34/313 |
| 2012/0205850 | A1 * | 8/2012 | Zama | G01N 21/9501 269/55 |
| 2018/0277417 | A1 * | 9/2018 | Ishii | H01L 21/6708 |
| 2019/0311938 | A1 * | 10/2019 | Chen | H01L 21/68735 |
| 2019/0318954 | A1 * | 10/2019 | Kobayashi | H01L 21/68721 |
| 2020/0203189 | A1 * | 6/2020 | Hachiya | H01L 21/68728 |
| 2021/0249235 | A1 * | 8/2021 | Kato | H01J 37/32715 |

FOREIGN PATENT DOCUMENTS

| CN | 115020317 | A | * | 9/2022 | |
| CN | 115647969 | A | | 1/2023 | |
| CN | 116053189 | A | * | 5/2023 | |
| CN | 117086556 | A | * | 11/2023 | |
| CN | 117116840 | A | * | 11/2023 | |
| CN | 117198957 | A | * | 12/2023 | |
| CN | 118039548 | A | * | 5/2024 | ............ B08B 13/00 |
| JP | 2022155377 | A | * | 10/2022 | ....... H01L 21/67051 |

* cited by examiner

*Primary Examiner* — Benjamin L Osterhout

(57) ABSTRACT

The present disclosure provides a semiconductor processing equipment, including a positioning plate, clamping column units and a control component. The clamping column units include: axial center parts, clamping parts arranged at top ends of the axial center parts, second sealing rings arranged around outer sides of the axial center parts and clamped between the clamping part and the positioning plate, and first connecting rods. An annular assembly base is axially arranged on an inner side of the positioning plate, and the annular assembly base is configured with second connecting rods longitudinally corresponding to positions of the first connecting rods. By mounting the second sealing ring in a non-rigidly fixed manner between the clamping part and the positioning plate, the present application achieves a reduction in a degree of deformation of the second sealing ring.

18 Claims, 16 Drawing Sheets

SEMICONDUCTOR PROCESSING EQUIPMENT

CROSS-REFERENCE TO RELATED APPLICATION

This application claims priority of Chinese Patent Application No. 202410263804.4, filed on Mar. 8, 2024, the entire contents of which are incorporated herein by reference.

TECHNICAL FIELD

The present disclosure relates to the technical field of semiconductors, and in particular to a semiconductor processing equipment.

BACKGROUND

Third-generation semiconductor substrates are represented by four materials, including gallium nitride (GaN), silicon carbide (SIC), zinc oxide (ZnO), and diamond (C). These materials possess characteristics such as wider bandgap, higher radiation resistance, and greater electron saturation drift velocity, making them suitable for the fabrication of high-temperature, high-frequency, radiation-resistant, and high-power electronic equipments. Due to the slow growth rate and high cost of the third-generation semiconductor substrates, the prior art often employs relatively inexpensive substrates in conjunction with third-generation semiconductor materials. Correspondingly, the third-generation semiconductor substrates, primarily SIC, need a reduced thickness (typically below 0.8 mm). In the field of semiconductor substrates, SIC semiconductor substrates are also referred to as wafer.

The semiconductor substrate cleaning equipment in the prior art is arranged with a rotating mechanism for fixing and carrying wafer, and a CUP (or "splash guard") surrounded an outer side of the rotating mechanism. A carrying plate (or "rotating plate") for fixing the wafer is arranged at a top of the rotating mechanism. Generally, the wafer is adsorbed and fixed by negative pressure air holes arranged on the rotating plate, or clamped and fixed by a clamping column component mounted on the rotating plate.

During wafer cleaning, to prevent the cleaning solution from penetrating into the gap between a clamping column and the rotating plate, a sealing ring is usually arranged between them, reducing the possibility of cleaning solution infiltration during the transition between states of a clamping block when it is not clamping the wafer and when it is clamping the wafer. However, the rigid and fixed mounting of the sealing ring between the clamping column and the rotating plate inevitably leads to an increase in the rotational resistance of the clamping column and an augmentation in the deformation of the sealing ring, which in turn affects the rotational efficiency of the clamping column and shortens the service life of the sealing ring.

In view of this, it is necessary to improve the semiconductor processing equipment in the prior art to solve the above problems.

SUMMARY

An objective of the present disclosure is to disclose a semiconductor processing equipment for solving the aforementioned technical problems, and particularly for solving the technical problems in the prior art that rotational resistance of a clamping column and deformation of a sealing ring are increased, and service life of the sealing ring is reduced by rigid and fixed mounting of the sealing ring between the clamping column and a rotating plate.

To achieve the above objective, the present disclosure provides a semiconductor processing equipment, including: a positioning plate, three clamping column units or more longitudinally penetrating through and rotatably connected to the positioning plate, and a control component driving a plurality of the clamping column units to rotate to clamp or release a wafer.

The clamping column units include: axial center parts, clamping parts arranged at top ends of the axial center parts, second sealing rings arranged around outer sides of the axial center parts and clamped between the clamping part and the positioning plate, at least two sets of first connecting rods with an equal spacing formed by protruding from ends of the axial center parts passing through the positioning plate, and second elastic components connected to the first connecting rods.

An annular assembly base is axially arranged on an inner side of the positioning plate, and the annular assembly base is configured with second connecting rods longitudinally corresponding to positions of the first connecting rods; two ends of each of the second elastic components are respectively connected to the first connecting rod and the second connecting rod, to maintain the second elastic component in an initial tensile state, and the second elastic component exerts a longitudinally downward elastic force on the clamping part to clamp the second sealing ring between the clamping part and the positioning plate.

In a further solution of the present disclosure, in a process of switching the clamping column units from a state of clamping the wafer to a state of not clamping the wafer, the first connecting rods are simultaneously driven by the axial center parts, and the second elastic component is further stretched from the initial tensile state.

In a process of switching the clamping column units from the state of not clamping the wafer to the state of clamping the wafer, the first connecting rods are simultaneously driven by the axial center parts, and the further stretched second elastic component contracts and returns to the initial tensile state.

In a further solution of the present disclosure, the axial center parts protrude longitudinally downward to form anti-deviation protrusion parts, the annular assembly base is configured with anti-deviation grooves for being inserted by at least parts of the anti-deviation protrusion parts, and the anti-deviation groove is rotatably engaged with the anti-deviation protrusion part.

In a further solution of the present disclosure, the semiconductor processing equipment further includes: a driving unit for driving the positioning plate to rotate in an axial direction, and a hollow drive shaft coaxially fixed to the positioning plate formed by the driving unit.

The control component includes: a transmission plate coaxially sleeved on the hollow drive shaft, the transmission plate being rotatably connected to the hollow drive shaft and driving the clamping column units to rotate around their own axis, a plurality of holding components for driving the transmission plate to rotate in a first direction, and a release component formed on a longitudinal inner side of the transmission plate and driving the transmission plate to rotate in a second direction opposite to the first direction.

The transmission plate rotates in the first direction relative to the positioning plate in a stationary state rotates to drive the clamping column units to switch from the state of not clamping the wafer to the state of clamping the wafer, and the transmission plate rotates in the second direction relative to the positioning plate in the stationary state to drive the clamping column units to switch from the state of clamping the wafer to the state of not clamping the wafer.

In a further solution of the present disclosure, ends of the axial center parts close to the first connecting rods are configured with gear actuating parts, and the gear actuating parts mesh with gear block parts formed at an outer peripheral edge of the transmission plate.

The gear block part is simultaneously driven by a rotation of the transmission plate to rotate circumferentially around the axial direction, and the gear block part meshes with the gear actuating part to drive the clamping column units to rotate around their own axis in mounting holes disposed on the positioning plate to ensure that the clamping part clamps or releases the wafer.

In a further solution of the present disclosure, the positioning plate protrudes downward in the axial direction to form a protruding part coaxially fixed to the hollow drive shaft, the transmission plate protrudes upward in the axial direction to form a transmission part arranged around an outer side of the protruding part, the transmission part is configured with a plurality of space-keeping grooves, and the protruding part protrudes outward in a radial direction to form protruding blocks extending into the space-keeping grooves.

The holding component drives the transmission plate to rotate in the first direction to drive walls of the space-keeping grooves to abut against the protruding blocks, and drive the clamping column units to clamp the wafer; the hollow drive shaft drives the positioning plate to rotate in the second direction, and the positioning plate drives the protruding blocks to rotate simultaneously to achieve the rotation of the transmission plate at the same speed as the positioning plate by using the protruding blocks to pull the walls of the space-keeping grooves.

In a further solution of the present disclosure, the holding component includes: first connecting columns arranged on the positioning plate, second connecting columns arranged on the transmission plate, and first elastic components with their two ends respectively connected to the first connecting columns and the second connecting columns.

The first elastic components exert an elastic force on the second connecting columns to drive the transmission plate to rotate in the first direction relative to the positioning plate, driving the clamping column units to switch from the state of not clamping the wafer to the state of clamping the wafer.

In a further solution of the present disclosure, the transmission plate protrudes downward in the axial direction to form a transmission ring, and one side of the transmission ring facing the release component is concavely arranged to form an angled guiding surface relative to a horizontal plane on which the transmission plate is arranged.

The release component includes: a lifting unit, a connecting ring formed on an outer side of the hollow drive shaft and controlled by the lifting unit to perform lifting and lowering movement in the axial direction, and a guiding component arranged on the connecting ring and facing the guiding surface.

In a process of the lifting unit driving the connecting ring to drive the guiding component to move upward in the axial direction, the guiding component is in contact with the guiding surface to drive the transmission ring to rotate in the axial direction, and the transmission plate rotates in the second direction relative to the positioning plate in a passive manner, driving the clamping column units to switch from the state of clamping the wafer to the state of not clamping the wafer.

In a further solution of the present disclosure, the semiconductor processing equipment further includes: a chamber body mechanism circumferentially arranged around outer sides of the positioning plate and the driving unit and formed with an accommodating chamber, and a wind pressure component arranged on the inner side of the positioning plate along the axial direction.

The wind pressure component includes: the annular assembly base fixed coaxially to the positioning plate, and a plurality of wind blade units annularly arranged on the annular assembly base and formed in the accommodating chamber.

The annular assembly base rotates along with a rotation of the positioning plate, driving the wind blade units to rotate around an axis of the positioning plate and push gas to flow downward in the axial direction in the accommodating chamber.

In a further solution of the present disclosure, the wind blade units include: connecting blocks, and wind blade parts integrally formed are disposed at bottoms of the connecting blocks.

The annular assembly base is configured with mounting grooves conformed to outer contours of the connecting blocks, and the connecting block is movably embedded in the mounting groove, exposing the wind blade part in the accommodating chamber.

In a further solution of the present disclosure, the driving unit is arranged in the accommodating chamber, and the driving unit includes: a rear spray pipe axially penetrating through inner sides of the positioning plate and the hollow drive shaft.

A gas collection chamber is enclosed and formed between the positioning plate and the rear spray pipe, the rear spray pipe is configured with a gas transmission channel connected to the gas collection chamber and delivering the gas to the gas collection chamber, the positioning plate is configured with a plurality of platform through-holes connected to the gas collection chamber, allowing for delivering the gas in the gas collection chamber to a wind supply chamber enclosed and formed by the positioning plate and the annular assembly base through the platform through-holes, and gas in the wind supply chamber is driven by a rotation of the wind blade units to be delivered axially downwards into the accommodating chamber.

In a further solution of the present disclosure, wind guiding ends extending inward in a radial direction through an inner edge of the annular assembly base are formed on the wind blade parts, and the gas in the wind supply chamber is delivered downward into the accommodating chamber in the axial direction through the wind guiding ends when the wind blade units rotate.

In a further solution of the present disclosure, the wind pressure component further includes: limiting rings radially abutted against inner side ends of the connecting blocks, and a plurality of first locking components penetrating through the limiting rings and extending at least partially into the connecting blocks or the annular assembly base.

In a further solution of the present disclosure, the second connecting rod is arranged at one side of a bottom of the annular assembly base opposite to the clamping column units, the annular assembly base is configured with foolproofing grooves for the second elastic components to penetrate through, the two ends of each of the second elastic components are respectively connected to ends of the first connecting rods and the second connecting rods extending through the gear actuating parts, and the second elastic component rotates with a rotation of the first connecting rod and stretches in the fool-proofing groove.

In a further solution of the present disclosure, the semiconductor processing equipment further includes: a housing and at least two sets of gas-liquid spraying mechanisms formed on a circumferentially outer side of the chamber body mechanism and arranged inside the housing. The gas-liquid spraying mechanisms include first cylinder bodies and second cylinder bodies sleeved inside and outside, spray pipes penetrating through the first cylinder bodies and fixedly arranged on the second cylinder bodies, and adjusting mechanisms that drive the second cylinder bodies to move longitudinally relative to the first cylinder bodies to adjust height of the spray pipes.

The adjusting mechanisms include: fixing pipes arranged on outer side walls of the second cylinder bodies, guiding grooves longitudinally disposed on walls of the second cylinder bodies, guideways arranged on outer side walls of the first cylinder bodies along the longitudinal direction and formed in the guiding grooves, and threaded rods arranged in and rotatably connected to the fixing pipes.

The guideway is configured with threaded racks engaged with the threaded rods, and by rotating relative to the fixing pipes and engaging with the threaded racks, the threaded rods drive the fixing pipes and the second cylinder bodies to drive the guiding grooves to move longitudinally along the guideways, adjusting longitudinal height of the spray pipes.

In a further solution of the present disclosure, the adjusting mechanisms further include: fourth locking components continuously penetrating through the fixing pipes and the second cylinder bodies, and the fourth locking components are adjustable along their own axis to abut against the first cylinder bodies and restrict a longitudinal movement of the second cylinder bodies relative to the first cylinder bodies.

In a further solution of the present disclosure, the chamber body mechanism includes: a chamber body base forming the accommodating chamber, and a compound hood structure coaxially arranged on an outer side of the chamber body base. The compound hood structure includes: two or more inner hoods stacked inside and outside, and outer hoods coaxially sleeved on the inner hoods.

The semiconductor processing equipment further includes elevating and lowering units driving the inner hoods and the outer hoods to perform lifting movements respectively, and by driving the inner hoods and the outer hoods to perform the lifting movements, cleaning solution is collected through the inner hoods and the outer hoods in different cleaning modes.

In a further solution of the present disclosure, the semiconductor processing equipment further includes: a fan filter component formed above the chamber body mechanism and arranged on the housing, a gas extraction component connected to the chamber body mechanism and arranged at a bottom of the housing, a wafer transfer component arranged on a side wall of the housing, and an imaging equipment and a light sensing equipment arranged in the housing.

The wafer transfer component includes: a wafer transfer port disposed at a side portion of the housing, a baffle arranged on an outer side of the wafer transfer port, an air cylinder connected below the baffle, and an electrostatic eliminator arranged towards the wafer transfer port.

Compared with the prior art, the present disclosure has the following advantageous effects. The first connecting rod is pulled downward along the longitudinal direction through an elastic force exerted by the second elastic component, driving the axial center part to press the clamping part downward against the second sealing ring. This compresses the second sealing ring between the clamping part and the positioning plate, ensuring seal tightness between the clamping part and the positioning plate. Furthermore, the second sealing ring is mounted between the clamping part and the positioning plate in a non-rigid and fixed manner, reducing rotational resistance of the clamping column unit and minimizing deformation degree of the second sealing ring, enhancing service life of the second sealing ring.

DETAILED DESCRIPTION

Figure 1:
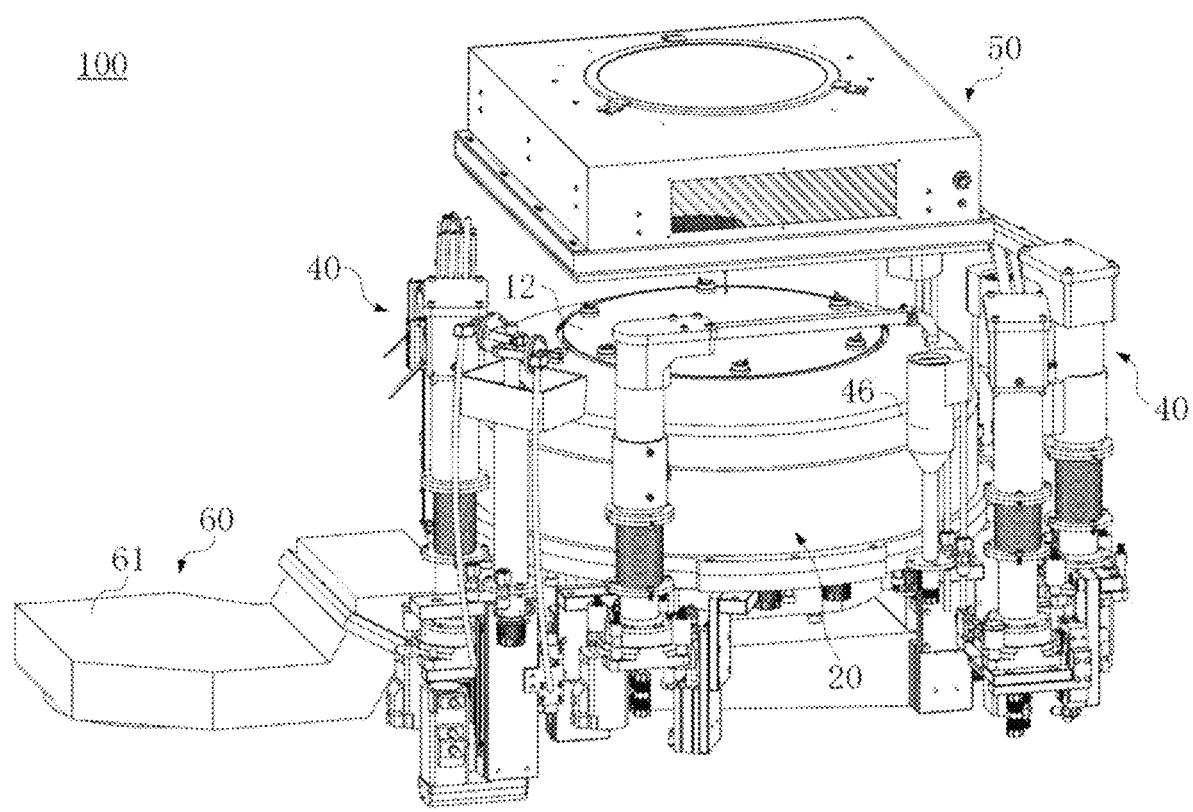
FIG. 1 is an overall schematic structural diagram of a semiconductor processing equipment disclosed by the present disclosure.

The present disclosure will be described in detail below with reference to various embodiments shown in the accompanying drawings, but it is to be understood that these embodiments are not intended to limit the present disclosure. Functional, methodological, or structural equivalent transformations or substitutions made by those skilled in the art based on these embodiments fall within the scope of protection of the present disclosure.

It is particularly important to note that in the following examples, the term "axial direction" refers to the direction indicated by the axis P of the positioning plate 12 in FIG. 3. The term "longitudinal" refers to a direction parallel to the axial direction. The term "first direction" refers to the direction indicated by arrow X1 in FIG. 8. The term "second direction" refers to the direction indicated by arrow X2 in FIG. 8.

Please refer to FIGS. 1-18 for a specific embodiment of a semiconductor processing equipment.

Referring to FIGS. 7-10, in this embodiment, the semiconductor processing equipment 100 includes: a positioning plate 12, three clamping column units 15 or more longitudinally penetrating through the positioning plate 12 and rotatably connected to the positioning plate 12, and a control component (not shown) driving a plurality of the clamping column units 15 to rotate to clamp or release a wafer. The clamping column units 15 include axial center parts 151, clamping parts 152 arranged at top ends of the axial center parts 151, second sealing rings 1552 arranged around outer sides of the axial center parts 151 and clamped between the clamping part 152 and the positioning plate 12, at least two sets of first connecting rods 1511 with an equal spacing formed by protruding from ends of the axial center parts 151 passing through the positioning plate 12, and second elastic components 157 connected to the first connecting rods 1511. An annular assembly base 131 is axially arranged on an inner side of the positioning plate 12, and the annular assembly base 131 is configured with second connecting rods 1313 longitudinally corresponding to positions of the first connecting rods 1511. Two ends of each of the second elastic components 157 are respectively connected to the first connecting rod 1511 and the second connecting rod 1313, to maintain the second elastic component 157 in an initial tensile state. The second elastic component 157 exerts a longitudinally downward (as shown by arrow Z in FIG. 10) elastic force on the clamping part 152 to clamp the second sealing ring 1552 between the clamping part 152 and the positioning plate 12. An outer edge of the annular assembly base 131 stretches upward in the axial direction to form an upper annular hood 1316 abutted against the positioning plate 12, and a third sealing ring 1317 is arranged between the upper annular hood 1316 and the positioning plate 12. The third sealing ring 1317 prevents cleaning solution from penetrating into the annular assembly base 131 through a connection between the upper annular hood 1316 and the positioning plate 12, and the annular assembly base 131 is coaxially fixed to the positioning plate 12, enabling the annular assembly base 131 to rotate as the positioning plate 12 rotates.

Figure 10:
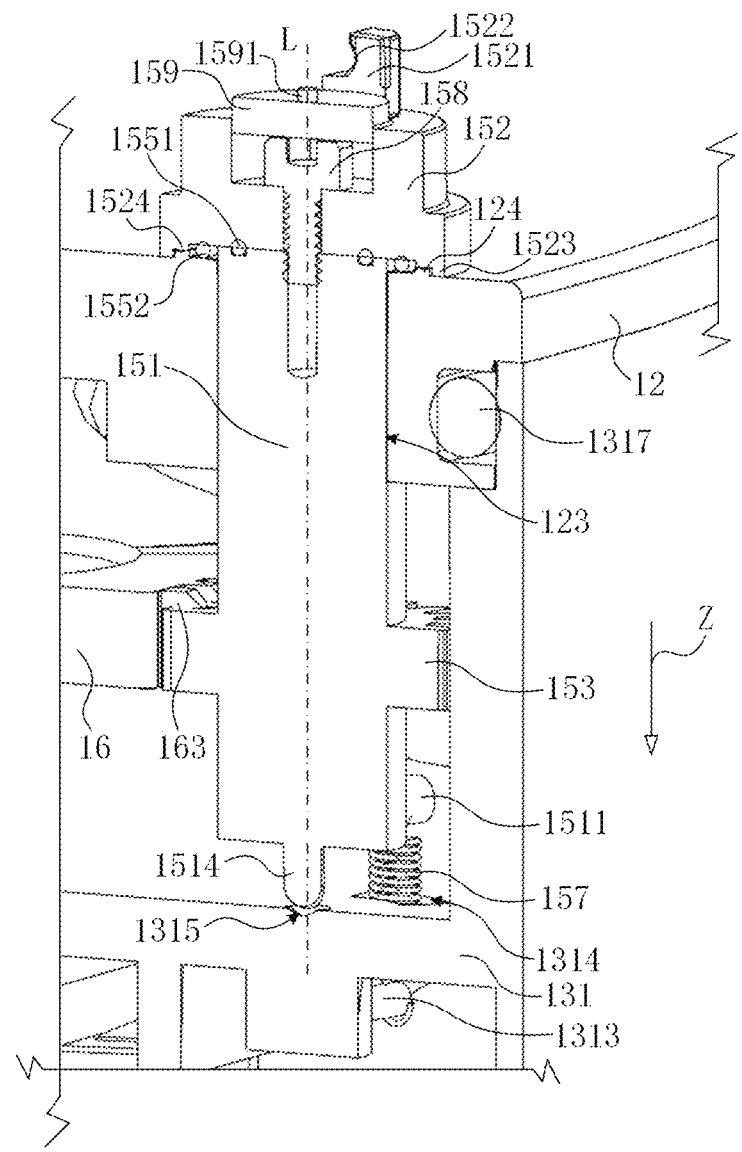
FIG. 10 is a cross-sectional perspective view of a connection between a clamping column unit and the positioning plate.

Two ends of each of the second elastic components 157 are respectively connected to the first connecting rod 1511 and the second connecting rod 1313, the second elastic components 157 mounted on the connecting rod 1511 and the second connecting rod 1313 are maintained in the initial tensile state (as shown in FIG. 10), and the second elastic component 157 is preferably not in an ultimate tensile state. Since the second connecting rod 1313 is fixed to the positioning plate 12, the first connecting rod 1511 is pulled by the second elastic component 157 in the tensile state downward longitudinally through the elastic force, driving the axial center part 151 to press the clamping part 152 downward against the second sealing ring 1552. This makes the second sealing ring 1552 be clamped between the clamping part 152 and the positioning plate 12, ensuring seal tightness between the clamping part 152 and the positioning plate 12 through the second sealing ring 1552. This prevents cleaning solution from penetrating into the clamping column unit 15 through a connection between the clamping part 152 and the positioning plate 12, preventing the cleaning solution from causing corrosion to components within the clamping column unit 15, including the axial center parts 151 and gear actuating parts 153, and enhancing durability of the clamping column units 15.

In the prior art, the sealing ring on an outer side of the clamping column unit is rigidly and fixedly mounted on the positioning plate 12. This results in significant rotational resistance influenced by the sealing ring during the rotation of the clamping column unit, and also leads to large deformation of the sealing ring, reducing service life of the sealing ring. Compared with the aforementioned clamping column unit in the prior art, the clamping column unit 15 in this embodiment pulls downward the first connecting rod 1511 along the longitudinal direction through an elastic force exerted by the second elastic component 157, driving the axial center part 151 to press the clamping part 152 downward against the second sealing ring 1552. This compresses the second sealing ring 1552 between the clamping part 152 and the positioning plate 12, ensuring seal tightness between the clamping part 152 and the positioning plate 12. Furthermore, the second sealing ring 1552 is mounted between the clamping part 152 and the positioning plate 12 in a non-rigid and fixed manner, reducing rotational resistance of the clamping column unit 15 and minimizing deformation degree of the second sealing ring 1552, enhancing service life of the second sealing ring 1552. Additionally, the second elastic component 157 is preferably a tension spring. In practical applications, second elastic components 157 with varying elastic coefficients can be selected to adjust magnitude of the elastic force applied by the second elastic component 157 to pull the axial center part 151 downward, regulating the rotational resistance of the clamping column unit 15 and the deformation degree of the second sealing ring 1552.

Specifically, referring to FIG. 10, in a process of switching the clamping column unit 15 from a state of clamping the wafer to a state of not clamping the wafer, the first connecting rod 1511 is simultaneously driven by the axial center part 151, and the second elastic component 157 is further stretched from the initial tensile state. In the process of the control component driving the clamping column unit 15 to switch from the state of clamping the wafer to the state of not clamping the wafer, the first connecting rod 1511 rotates around an axis L of the clamping column unit 15 in a third direction (i.e., the direction that allows the clamping column unit 15 to rotate and release the wafer) as the axial center part 151 rotates. This causes a longitudinally upper end of the second elastic component 157 connected to the first connecting rod 1511 to deflect around the axis L of the clamping column unit 15 and in the third direction, relative to a longitudinally lower end of the second elastic component 157 connected to the second connecting rod 1313. This deflection further stretches the second elastic component 157 (this state is not shown). Therefore, the elastic force applied by the second elastic component 157 to pull downward the axial center part 151 is increased, enhancing the clamping force applied by the clamping part 152 to the second sealing ring 1552. The seal tightness between the clamping part 152 and the positioning plate 12 is improved, preventing cleaning solution residue on the positioning plate 12 from cleaned wafer from penetrating into the clamping column unit 15 through the connection between the clamping part 152 and the positioning plate 12 in a wafer exchange process.

Specifically, referring to FIG. 10, in a process of switching the clamping column unit 15 from a state of not clamping the wafer to a state of clamping the wafer, the axial center part 151 drives the first connecting rod 1511 to rotate synchronously, and the further stretched second elastic component 157 contracts and resets to the initial tensile state. In the process of the control component driving the clamping column unit 15 to switch from the state of not clamping the wafer to the state of clamping the wafer, the first connecting rod 1511 rotates around the axis L of the clamping column unit 15 in a fourth direction (i.e., the direction that allows the clamping column unit 15 to rotate and clamp the wafer) opposite to the third direction. This causes the first connecting rod 1511 to drive the longitudinally upper end of the second elastic component 157 to reset along the axis L of the clamping column unit 15 and in the fourth direction, relative to the longitudinally lower end of the second elastic component 157, allowing the second elastic component 157 to contract and reset to an unstressed state (i.e., the initial tensile state). Therefore, the second elastic component 157 maintains the elastic force pulling downward the axial center part 151, so that the second sealing ring 1552 can be clamped between the axial center part 151 and the positioning plate 12 all the time. The ensures the seal tightness between the axial center part 152 and the positioning plate 12, preventing cleaning solution from penetrating into the clamping column unit 15.

Specifically, referring to FIG. 10, the axial center parts 151 protrude longitudinally downward to form anti-deviation protrusion parts 1514, the annular assembly base 131 is configured with anti-deviation grooves 1315 for being inserted by at least parts of the anti-deviation protrusion parts 1514, and the anti-deviation groove 1315 is rotatably engaged with the anti-deviation protrusion part 1514. During vertical assembly of the clamping column unit 15 onto the positioning plate 12, the axial center part 151 is pulled downward by the second elastic component 157 through the elastic force, causing the anti-deviation protrusion part 1514 to be inserted at least partially into the anti-deviation groove 1315. The anti-deviation protrusion part 1514 is simultaneously driven by the rotation of the clamping column unit 15 to rotate within the anti-deviation groove 1315, enabling the anti-deviation protrusion part 1514 to provide rotational support to the clamping column unit 15 and facilitating smoother rotation of the clamping column unit 15.

Specifically, referring to FIGS. 7-10, the semiconductor processing equipment 100 further includes a driving unit 11 for driving the positioning plate 12 to rotate in an axial direction, and a hollow drive shaft 111 coaxially fixed to the positioning plate 12 formed by the driving unit 11. The positioning plate 12 is driven by the driving unit 11 to rotate in an axial direction. The control component includes: a transmission plate 16 coaxially sleeved on the hollow drive shaft 111, the transmission plate 16 being rotatably connected to the hollow drive shaft 111 and driving the clamping column unit 15 to rotate around its own axis L, a plurality of holding components 17 for driving the transmission plate 16 to rotate in a first direction, and a release component 18 formed on a longitudinal inner side of the transmission plate 16 and driving the transmission plate 16 to rotate in a second direction opposite to the first direction. The transmission plate 16 rotates in the first direction relative to the positioning plate 12 in a stationary state to drive the clamping column unit 15 to switch from the state of not clamping the wafer to the state of clamping the wafer, and the transmission plate 16 rotates in the second direction relative to the positioning plate 12 in the stationary state rotates to drive the clamping column unit 15 to switch from the state of clamping the wafer to the state of not clamping the wafer. When it is necessary to remove cleaned wafer, the driving unit 11 stops driving the positioning plate 12 to rotate and keeps the positioning plate 12 in the stationary state. This is to prevent the positioning plate 12 from rotating due to forces other than those from the driving unit 11, avoiding any adverse effects on the clamping effect of the clamping column unit 15 on the wafer. The release component 18 drives the transmission plate 16 to rotate relative to the positioning plate 12 in the second direction, driving the clamping column unit 15 to rotate around its own axis L via the transmission plate 16. This causes the clamping column unit 15 to switch from the state of clamping the wafer to the state of not clamping the wafer. The wafer is released by the clamping column unit 15, enabling the cleaned wafer supported by the clamping column unit 15 to be removed. Subsequently, a wafer to be cleaned is placed into the clamping column unit 15. After the wafer to be cleaned is placed into the clamping column unit 15 for supporting, a driving effect exerted on the transmission plate 16 by the release component 18 is ceased. By driving the transmission plate 16 to rotate relative to the positioning plate 12 in the first direction through the holding component 17, the transmission plate 16 causes the clamping column unit 15 to rotate around its own axis L, allowing the clamping column unit 15 to switch from the state of not clamping the wafer to the state of clamping the wafer. Additionally, the holding component 17 is capable of maintaining the clamping state of the clamping column unit 15 to prevent the wafer from detaching during rotation and cleaning.

Specifically, referring to FIG. 10, ends of the axial center parts 151 close to the first connecting rods 1511 are configured with gear actuating parts 153, and the gear actuating parts 153 mesh with gear block parts 163 formed at an outer peripheral edge of the transmission plate 16. The gear block part 163 is simultaneously driven by a rotation of the transmission plate 16 to rotate circumferentially around the axial direction, and the gear block part 163 meshes with the gear actuating part 153 to drive the clamping column units 15 to rotate around their own axis in mounting holes 123 disposed on the positioning plate 12 to ensure that the clamping part 152 clamps or releases the wafer. During the rotation of the transmission plate 16 in either the first direction or the second direction, the gear block part 163 is driven to rotate around an axis P. Through the engagement between the gear block part 163 and the gear actuating part 153, the axial center part 151 is driven to rotate within the mounting hole 123 around the axis L. This allows the clamping part 152 to transition from the state of not clamping the wafer to the state of clamping the wafer, or vice versa. Moreover, the gear block part 163 and the gear actuating part 153 remain engaged at all times to ensure that stability of the clamping part 152 in clamping the wafer is not compromised.

Specifically, referring to FIG. 10, the second connecting rod 1313 is arranged at one side of a bottom of the annular assembly base 131 opposite to the clamping column units 15, the annular assembly base 131 is configured with foolproofing grooves 1314 for the second elastic components 157 to penetrate through, the two ends of each of the second elastic components 157 are respectively connected to ends of the first connecting rods 1511 and the second connecting rods 1313 extending through the gear actuating parts 153, and the second elastic component 157 rotates with a rotation of the first connecting rod 1511 and stretches in the fool-proofing groove 1314. In this embodiment, the fool-proofing groove 1314 is arcuate. The second elastic component 157 can be guided and constrained through the fool-proofing groove 1314. This prevents the second elastic component 157 from contacting the gear actuating part 153 during its rotation with the first connecting rod 1511 and subsequent deflection and stretching within the fool-proofing groove 1314, avoiding interference with the engagement between the gear actuating part 153 and the gear block part 163.

Specifically, referring to FIGS. 6-9, the positioning plate 12 protrudes downward in the axial direction to form a protruding part 121 coaxially fixed to the hollow drive shaft 111, the transmission plate 16 protrudes upward in the axial direction to form a transmission part 161 arranged around an outer side of the protruding part 121, the transmission part 161 is configured with a plurality of space-keeping grooves 1611, and the protruding part 121 protrudes outward in a radial direction to form protruding blocks 1212 extending into the space-keeping grooves 1611. The holding component 17 drives the transmission plate 16 to rotate in the first direction to drive walls 1612 of the space-keeping grooves 1611 to abut against the protruding blocks 1212, and drive the clamping column units 15 to clamp the wafer. The hollow drive shaft 111 drives the positioning plate 12 to rotate in the second direction, and the positioning plate 12 drives the protruding blocks 1212 to rotate simultaneously to achieve the rotation of the transmission plate 16 at the same speed as the positioning plate 12 by using the protruding blocks 1212 to pull the walls 1612 of the space-keeping grooves 1611.

After the wafer to be cleaned is placed into the clamping column unit 15 for supporting, a driving effect exerted on the transmission plate 16 by the release component 18 is ceased. By driving the transmission plate 16 to rotate in the first direction and relative to the positioning platen 12 through the holding component 17, the transmission plate 16 causes the clamping column unit 15 to rotate around its own axis L. This transitions the clamping column unit 15 from the state of not clamping the wafer to the state of clamping the wafer. Additionally, the holding component 17 is capable of maintaining the clamping state of the clamping column unit 15. At the same, the transmission part 161 will drive the wall 1612 of the space-keeping groove 1611 to abut against the protruding block 1212 in the first direction. Subsequently, the hollow drive shaft 111 drives the positioning plate 12 to rotate in the second direction to make sure that the positioning plate 12 drives the protruding block 1212 to rotate simultaneously. Therefore, the wall 1612 of the space-keeping groove 1611 is pushed by the protruding block 1212 in the second direction, so that the transmission part 161 is driven by the protruding block 1212 to rotate the transmission plate 16 and the positioning plate 12 at the same speed in the second direction.

When it is necessary to remove the cleaned wafer, the hollow drive shaft 111 stops driving the positioning plate 12 to rotate and keeps the positioning plate 12 in the stationary state. The release component 18 is activated to drive the transmission plate 16 to rotate in the second direction relative to the positioning plate 12, causing the transmission plate 16 to rotate the clamping column unit 15 around its own axis L. This allows the clamping column unit 15 to switch from the state of clamping the wafer to the state of not clamping the wafer, and the clamping column unit 15 releases the wafer. Simultaneously, the transmission part 161 will drive the space-keeping groove 1611 to rotate in the second direction relative to the protruding block 1212, separating the protruding block 1212 from the wall 1612 of the space-keeping groove 1611 (a separated state not shown).

Figure 8:
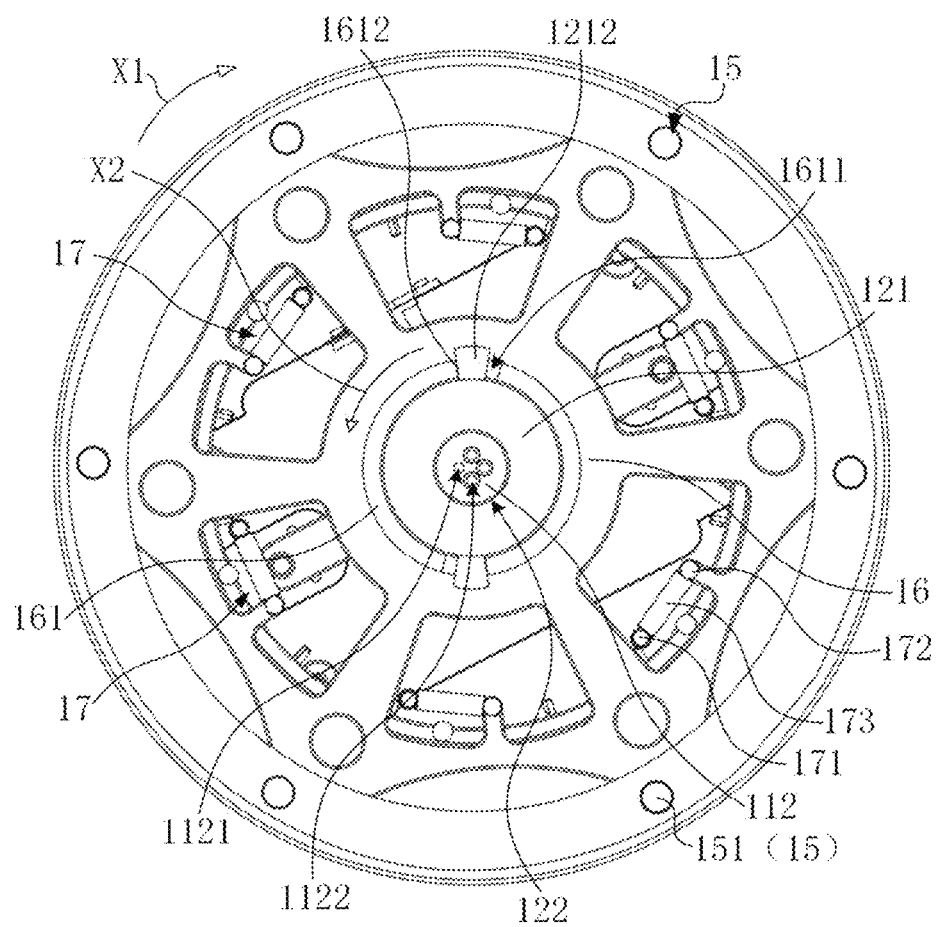
FIG. 8 is a cross-sectional view of a transmission part and a protruding part taken along D-D in FIG. 7, where a wall of a space-keeping groove abuts against a protruding block.
Figure 9:
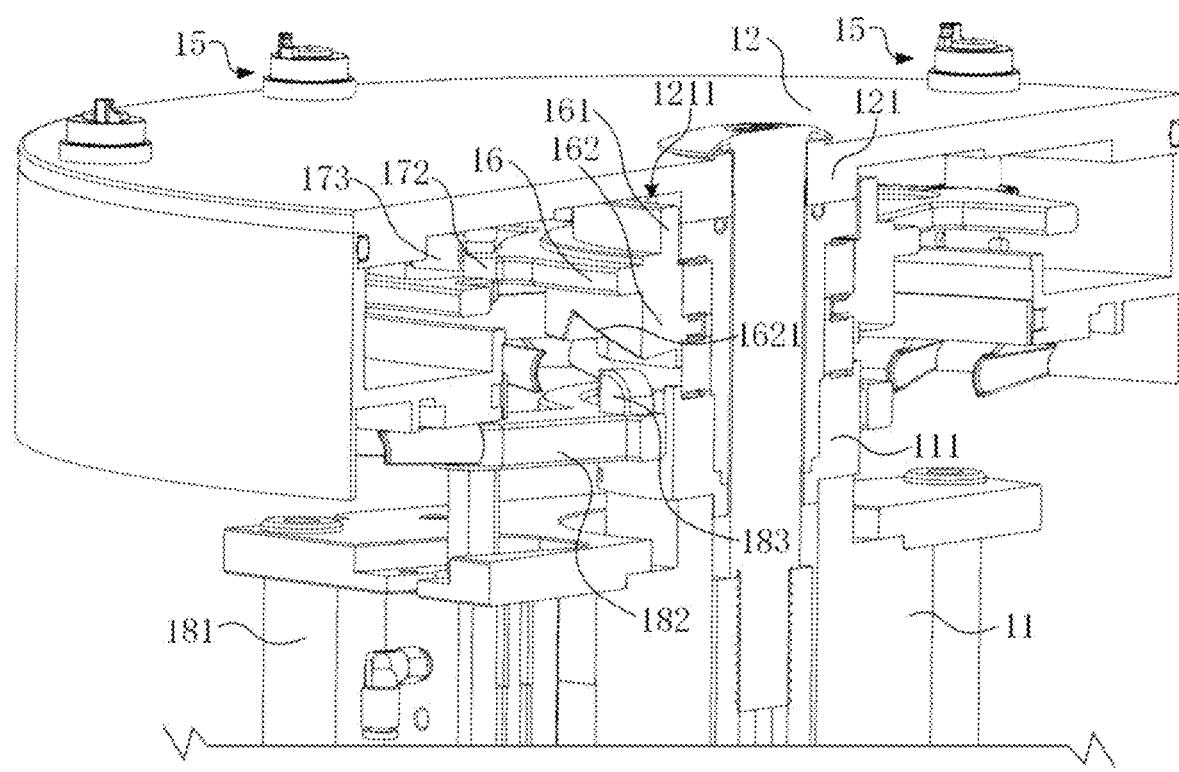
FIG. 9 is a partial perspective view of a connection between a release component and a transmission plate.

Specifically, referring to FIGS. 8-9, the holding component 17 includes first connecting columns 171 arranged on the positioning plate 12, second connecting columns 172 arranged on the transmission plate 16, and first elastic components 173 with their two ends respectively connected to the first connecting columns 171 and the second connecting columns 172. The first elastic components 173 exert an elastic force on the second connecting columns 172 to drive the transmission plate 16 to rotate in the first direction relative to the positioning plate 12, driving the clamping column units 15 to switch from the state of not clamping the wafer to the state of clamping the wafer.

When it is necessary to remove the cleaned wafer, the hollow drive shaft 111 stops driving the positioning plate 12 to rotate and keeps the positioning plate 12 in the stationary state. The release component 18 is activated to drive the transmission plate 16 to rotate in the second direction, causing the second connecting column 172 to rotate around the axis P of the positioning plate 12 relative to the first connecting column 171 through the transmission plate 16. This action stretches the first elastic component 173 and accumulates elastic potential energy in it until the clamping column unit 15 releases the wafer and remains in a state where it is not clamping the wafer, allowing the cleaned wafer to be removed. Depending on the elastic coefficients of the first elastic component 173, it may reach its ultimate tensile state at this point. At the same time, the space-keeping groove 1611 is driven by the transmission part 161 to rotate in the second direction relative to the protruding block 1212, causing the protruding block 1212 to separate from the wall 1612 of the space-keeping groove 1611. After the wafer to be cleaned is placed into the clamping column unit 15 for supporting, the driving effect exerted on the transmission plate 16 by the release component 18 is ceased. Therefore, the first elastic component 173 contracts and releases the elastic potential energy. In this process, the second connecting column 172 is pulled by the elastic force of the first elastic component 173 to rotate around the axis P of the positioning plate 12 relative to the first connecting column 171, which in turn drives the transmission plate 16 to rotate in the first direction and causes the clamping column unit 15 to clamp the wafer. This step continues until the first elastic component 173 is restored to its unstressed state. The elastic force exerted by the first elastic component 173 on the second connecting column 172 is maintained to prevent the transmission plate 16 from rotating in the second direction relative to the positioning plate 12 due to driving forces other than those from the release component 18. This ensures that the clamping column unit 15 remains in the state of clamping the wafer. The transmission plate 16 simultaneously rotated by the pulling force of the first elastic component 173 will drive the transmission part 161 to cause the wall 1612 of the space-keeping groove 1611 to abut against the protruding block 1212 in the first direction.

It is to be noted that the first connecting column 171 and the second connecting column 172 are spaced apart from each other. Preferably, the first elastic component 173 is a tension spring. Therefore, the transmission plate 16 can be driven by the elastic force exerted by the first elastic component 173 on the second connecting column 172 to rotate in the first direction, and the clamping column unit 15 is driven to clamp the wafer. This also maintains the clamping column unit 15 in the state of clamping the wafer.

By selecting first elastic components 173 with different elastic coefficients, the clamping force of the clamping column unit 15 on the wafer can be adjusted.

Specifically, referring to FIGS. 8-9, the transmission plate 16 protrudes downward in the axial direction to form a transmission ring 162, and one side of the transmission ring 162 facing the release component 18 is concavely arranged to form an angled guiding surface 1621 relative to a horizontal plane on which the transmission plate 16 is arranged. The release component 18 includes a lifting unit 181, a connecting ring 182 formed on an outer side of the hollow drive shaft 111 and controlled by the lifting unit 181 to perform lifting and lowering movement in the axial direction, and a guiding component 183 arranged on the connecting ring 182 and facing the guiding surface 1621. In a process of the lifting unit 181 driving the connecting ring 182 to drive the guiding component 183 to move upward in the axial direction, the guiding component 183 is in contact with the guiding surface 1621 to drive the transmission ring 162 to rotate in the axial direction, and the transmission plate 16 rotates in the second direction relative to the positioning plate 12 in a passive manner, driving the clamping column units 15 to switch from the state of clamping the wafer to the state of not clamping the wafer. When it is necessary to remove the cleaned wafer, the hollow drive shaft 111 stops driving the positioning plate 12 to rotate and keeps the positioning plate 12 in the stationary state. The lifting unit 181 drives the connecting ring 182 and the guiding component 183 to move axially upwards. The guiding component 183 will contact and abut against the guiding surface 1621. The guiding surface 1621 is designed with a certain inclination angle, enabling the guiding component 183, during its axial upward movement, to drive the transmission ring 162 to rotate axially. This allows the transmission plate 16 to rotate passively relative to the positioning plate 12 in the second direction, causing the clamping column units 15 to switch from the state of clamping the wafer to the state of not clamping the wafer, and enabling the removal of the cleaned wafer. The lifting unit 181 drives the connecting ring 182 and the guiding component 183 to move axially downwards. This action removes the driving effect of the guiding component 183 on the transmission ring 162, enabling the release component 18 to cease its driving effect on the transmission plate 16.

It is to be noted that the guiding component 183 can be configured as a protrusion structure with a smooth top end (as shown in FIG. 9), a spherical structure (not shown), or even a rolling wheel that rotates relative to the connecting ring 182 (not shown), as long as it is capable of driving the transmission ring 162 to rotate axially during its axial upward movement.

Specifically, referring to FIG. 10, the clamping column units 15 further include third locking components 158 penetrating the clamping part 152 and partially extending into the axial center parts 151, and a sealing base 159 embedded at a top of the clamping part 152 and adjustable around the axis of the clamping column unit 15. At least one supporting block 1591 for holding the wafer is formed on the top of the sealing seat 159. A clamping block 1521 is formed on the top of the clamping part 152, and a recess 1522 is configured on one side of the clamping block 1521 facing an edge of the wafer. The clamping part 152 is axially assembled onto the axial center part 151 by threadedly connecting the third locking component 158 to the clamping part 152 and the axial center part 151, and abutting the third locking component 158 against the clamping part 152. The wafer is supported by the supporting block 1591. It is to be noted that one or more sets of supporting blocks 1591 can be configured at the top of the sealing base 159, as long as they can support the wafer. This embodiment preferably employs one set of supporting block 1591, which can reduce contact area between the supporting block 1591 and the wafer, minimize contamination on a bottom of the wafer, and improve yield of the wafer during the cleaning process. The edge of the wafer is flush with the recess 1522 configured by the clamping block 1521, allowing the recess 1522 to accurately clamp the edge of the wafer. This enhances the rotational stability of the wafer and prevents detachment of the wafer from the recess 1522 during rotation.

Specifically, referring to FIG. 10, the positioning plate 12 protrudes to form a first liquid blocking ring part 124 surrounding the outer sides of the axial center parts 151. An outer edge of a bottom of the clamping part 152 extends downward along the longitudinal direction to form a second liquid blocking ring part 1523 surrounding an outer side of the first liquid blocking ring part 124. The bottom of the clamping part 152 protrudes towards the first liquid blocking ring part 124 to form a leak blocking part 1524. The leak blocking part 1524 and the first liquid blocking ring part 124 form a clearance fit, and preferably, the leak blocking part 1524 does not adhere to the first liquid blocking ring part 124. This avoids friction between the leak blocking part 1524 and the first liquid blocking ring part 124 during the rotation of the clamping column unit 15, reducing the rotational resistance of the clamping column unit 15. The first liquid blocking ring part 124, the second liquid blocking ring part 1523, and the leak blocking part 1524 serve to block the cleaning solution, preventing it from penetrating into the clamping column unit 15.

Figure 11:
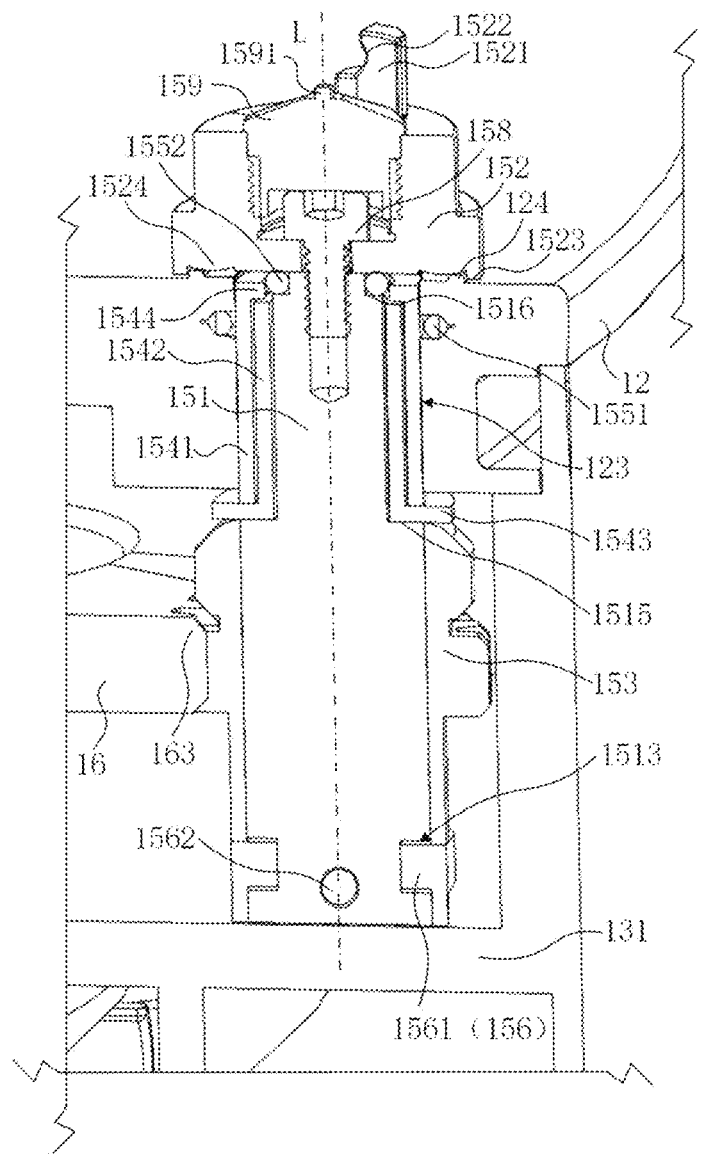
FIG. 11 is a cross-sectional perspective view of the connection between the clamping column unit and the positioning plate in another example, where a third seal ring is omitted.

Illustratively, in some examples, referring to FIG. 11, the clamping column units 15 further include outer thimbles 1541 embedded in the mounting holes 123 and formed on the outer sides of the axial center parts 151, inner thimbles 1542 coaxially arranged between the outer thimbles 1541 and the axial center parts 151, fixing components 156 arranged at bottom ends of the axial center parts 151, and the second sealing rings 1552 clamped between the clamping parts 152 and the axial center parts 151; and the gear actuating part 153 is clamped between the fixing component 156 and the inner thimble 1542. The axial center part 151 rotates relative to the outer thimble 1541 and the inner thimble 1542, or the axial center part 151 drives the inner thimble 1542 to rotate relative to the outer thimble 1541. First sealing rings 1551 are sleeved around outer circumferences of the outer thimbles 1541 and abutted against inner walls of the mounting holes 123, to improve the seal tightness between the outer thimble 1541 and the positioning plate 12, preventing the infiltration of cleaning solution.

It is to be noted that a clearance is formed between the inner thimble 1542 and the axial center part 151 to allow the axial center part 151 to rotate relative to the inner thimble 1542. Alternatively, a clearance is formed between the inner thimble 1542 and the outer thimble 1541, and the inner thimble 1542 is fixed to the axial center part 151, allowing the axial center part 151 to drive the inner thimble 1542 to rotate relative to the outer thimble 1541. Furthermore, clearances exist among the inner thimble 1542, the axial center part 151 and the outer thimble 1541, as long as the rotation of the axial center part 151 can be achieved. Preferably, in this embodiment, the clearance is formed between the inner thimble 1542 and the outer thimble 1541, and the inner thimble 1542 is fixed to the axial center part 151, allowing the axial center part 151 to drive the inner thimble 1542 to rotate relative to the outer thimble 1541, thereby reducing friction between the gear actuating part 153 and the inner thimble 1542.

In a process of mounting the clamping column unit 15 on the positioning plate 12, the outer thimble 1541 is first embedded into the mounting hole 123, and then the inner thimble 1542 is sleeved onto a top end of the axial center part 151. The gear actuating part 153 is sleeved on the axial center part 151 and abuts against the inner thimble 1542 longitudinally upwards. And the fixing component 156 is arranged at the bottom end of the axial center part 151 and abuts against the gear actuating part 153 longitudinally upwards to clamp the gear actuating part 153 between the inner thimble 1542 and the fixing component 156. Therefore, the axial center part 151 can be driven by the gear actuating part 153 to rotate simultaneously. Subsequently, the axial center part 151 and the inner thimble 1542 are mounted on the outer thimble 1541 longitudinally from a bottom to a top. And the clamping part 152 is axially assembled onto the axial center part 151 by threadedly connecting the third locking component 158 to the clamping part 152 and the axial center part 151, and by abutting the third locking component 158 against the clamping part 152, so that the clamping column unit 15 is assembled on the positioning plate 12. By configuring the clamping column unit 15 on the positioning plate 12 in a segmented and vertically stacked manner, this mounting method is straightforward and facilitates disassembly and assembly of the clamping column unit 15, making maintenance or replacement more convenient. Being clamped tightly, the second sealing ring 1552 is deformed, and expands outwardly and abuts against the outer thimble 1541. The second sealing ring 1552 enhances the seal tightness between the clamping part 152, the axial center part 151, and the outer thimble 1541, preventing cleaning solution from penetrating into the clamping column unit 15. This prevent solution from causing corrosion to components within the clamping column unit 15, including the axial center part 151 and the gear actuating part 153, enhancing the durability of the clamping column unit 15.

Further, referring to FIG. 11, the axial center parts 151 are configured with a first step recess 1515, and a bottom end of the inner thimble 1542 extends outward to form an outer edge 1543 supported by the first step recess 1515 and the gear actuating part 153 on the same side. A top end of the outer thimble 1541 extends inwardly to form an inner edge 1544, the axial center parts 151 are configured with a second step recess 1516 for sleeving the second sealing ring 1552. The second sealing ring 1552 is clamped between the clamping part 152, the inner edge 1544, and the second step recess 1516. The axial center parts 151 are recessed inwardly in the radial direction relative to the axis L to form the first step recess 1515, the bottom end of the inner thimble 1542 extends outward in the radial direction relative to the axis L to form the outer edge 1543, the outer edge 1543 is clamped by the first step recess 1515 and the gear actuating part 153 on the same side, and the top end of the outer thimble 1541 extends inwardly in the radial direction relative to the axis L to form the inner edge 1544. Being clamped by the clamping part 152 and the axial center part 151, the second sealing ring 1552 is deformed, and expands outwardly and abuts against the inner edge 1544. This enhances the seal tightness between the clamping part 152, the axial center part 151, and the inner edge 1544 through the second sealing ring 1552, preventing cleaning solution from penetrating into the clamping column unit 15. This avoids corrosion of the internal components of the clamping column units 15, including the axial center part 151 and the gear actuating part 153, caused by the fluid, and improves the durability of the clamping column unit 15. In addition, by abutting the clamping part 152 against a top of the second step recess 1516, the second step recess 1516 plays a limiting role on the clamping part 152, preventing it from excessively clamping the second sealing ring 1552. This avoids increasing the deformation of the second sealing ring 1552, which might otherwise enhance contact force between the second sealing ring 1552 and the inner edge 1544 excessively. Consequently, the second step recess 1516 helps to prevent an increase in the rotational resistance of the clamping column unit 15.

Figure 12:
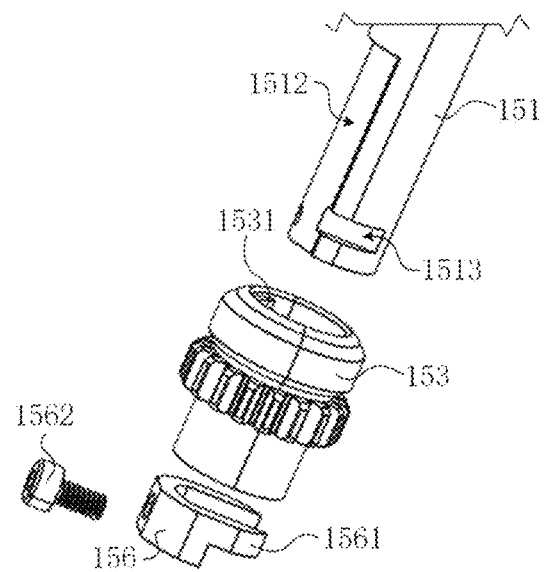
FIG. 12 is a partial exploded view of a connection between an axial center part and a gear actuating part.

Further, referring to FIGS. 11-12, the gear actuating part 153 protrudes inwardly to form guiding blocks 1531, the axial center parts 151 are recessed inwardly to form limiting grooves 1512 matching with outer contours of the guiding blocks 1531, and the gear actuating part 153 is coaxially sleeved on the axial center part 151 and guides the guiding block 1531 to movably embedded in the limiting groove 1512. The bottom ends of the axial center parts 151 are recessed to form retaining grooves 1513, and the fixing component 156 is configured with snap parts 1561 movably engaged in the retaining grooves 1513 and abutted against the gear actuating parts 153, and second locking components 1562 penetrating through the fixing component 156 and partially extend into the axial center parts 151. In a process of mounting the gear actuating part 153 on the axial center part 151, by aligning the guiding block 1531 with the limiting groove 1512, the guiding block 1531 is movably embedded into the limiting groove 1512 to restrict the rotation of the gear actuating part 153 relative to the axial center part 151, ensuring that the gear actuating part 153 and the axial center part 151 can rotate simultaneously, and avoiding excessive clamping of the wafer by the clamping column unit 15 or insufficient clamping force on the wafer. Subsequently, the gear actuating part 153 is abutted against the outer edge 1543 along the longitudinal upward. The snap part 1561 is movably embedded into the guiding block 1531. At the same time, a bottom end of the gear actuating part 153 is clamped by the snap part 1561 in a process of embebbing the snap part 1561 into the retaining groove 1513. This can restrict the displacement of the gear actuating part 153 along the longitudinal direction relative to the axial center part 151, preventing misalignment of the gear actuating part 153 relative to the gear block part 163 along the longitudinal direction. It ensures that the gear actuating part 153 remains engaged with the gear block part 163, and improves the stability of the gear actuating part 153 fixed to the axial center part 151, and enhances the assembly stability of the overall structure of the clamping column unit 15 as well.

Referring to FIGS. 3-6, the semiconductor processing equipment 100 further includes a chamber body mechanism 20 circumferentially arranged around outer sides of the positioning plate 12 and the driving unit 11 and formed with an accommodating chamber 211, and a wind pressure component 13 arranged on the inner side of the positioning plate 12 along the axial direction. The driving unit 11 is arranged in the accommodating chamber 211, the positioning plate 12 is formed on an outer side of the accommodating chamber 211, and the chamber body mechanism 20 on an outer side of the positioning plate 12 is used to collect cleaning solution during the wafer cleaning. The wind pressure component 13 includes the annular assembly base 131 fixed coaxially to the positioning plate 12, and a plurality of wind blade units 132 annularly arranged on the annular assembly base 131 and formed in the accommodating chamber 211. The annular assembly base 131 rotates along with a rotation of the positioning plate 12 to drive the wind blade units 132 to rotate around an axis of the positioning plate 12 and push gas to flow downward in the axial direction in the accommodating chamber 211.

Compared to the prior art where air between a processing cup and a partition plate is exhausted through exhaust ducts, this embodiment discloses a method where the positioning plate 12 is axially rotated by the driving unit 11, causing the wafer and the annular assembly base 131 to rotate simultaneously. This causes the annular assembly base 131 to drive the wind blade units 132 to rotate around the axis P of the positioning plate 12, pushing the gas to flow axially downwards (in the direction indicated by arrow a3 in FIG. 3) within the accommodating chamber 211 during the rotation. This generates an axially downward wind pressure within the accommodating chamber 211, preventing exhaust gases from surging out of the accommodating chamber 211 and avoiding the exhaust gases from diffusing towards the location of the wafer and contaminating the wafer, the annular assembly base 131, the positioning plate 12, and other components.

Figure 3:
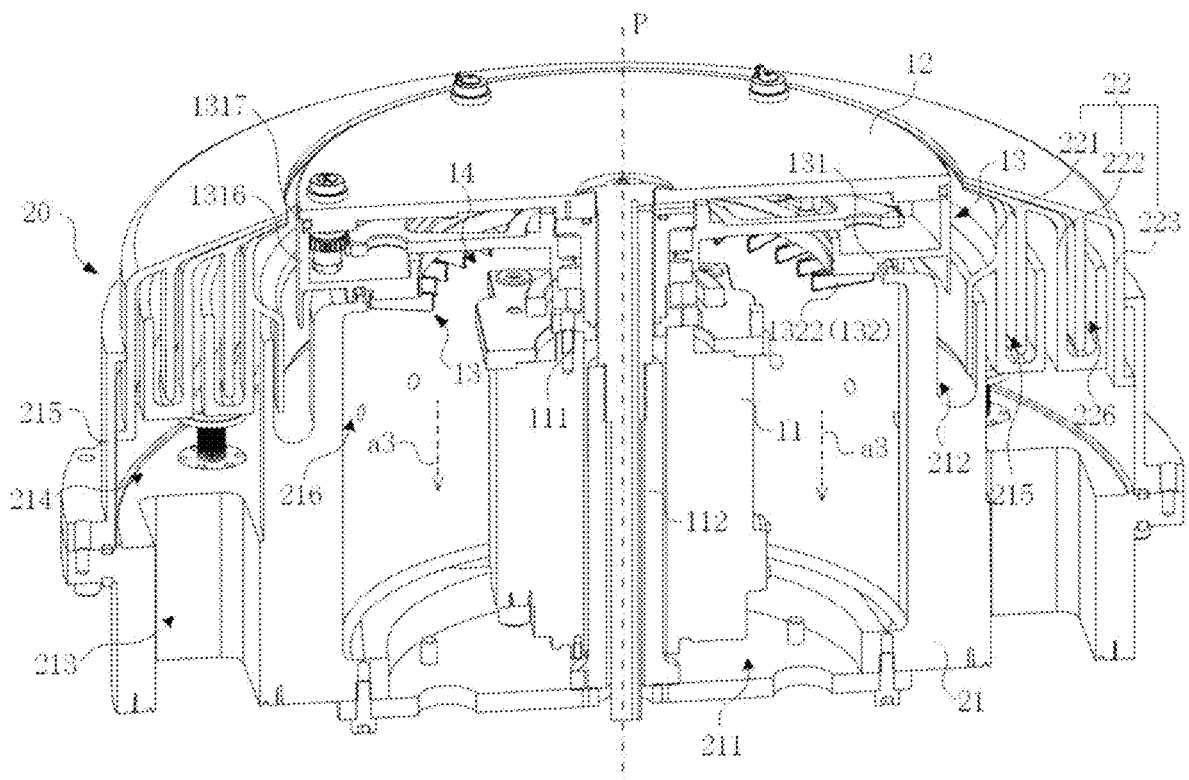
FIG. 3 is a cross-sectional perspective view of the connection between the chamber body mechanism and the positioning plate.
Figure 4:
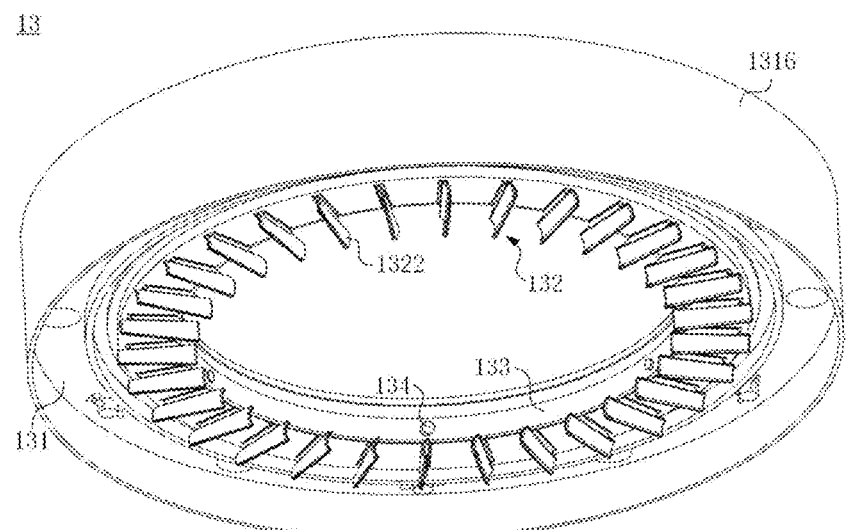
FIG. 4 is a perspective view of a wind pressure component in a bottom view.
Figure 5:
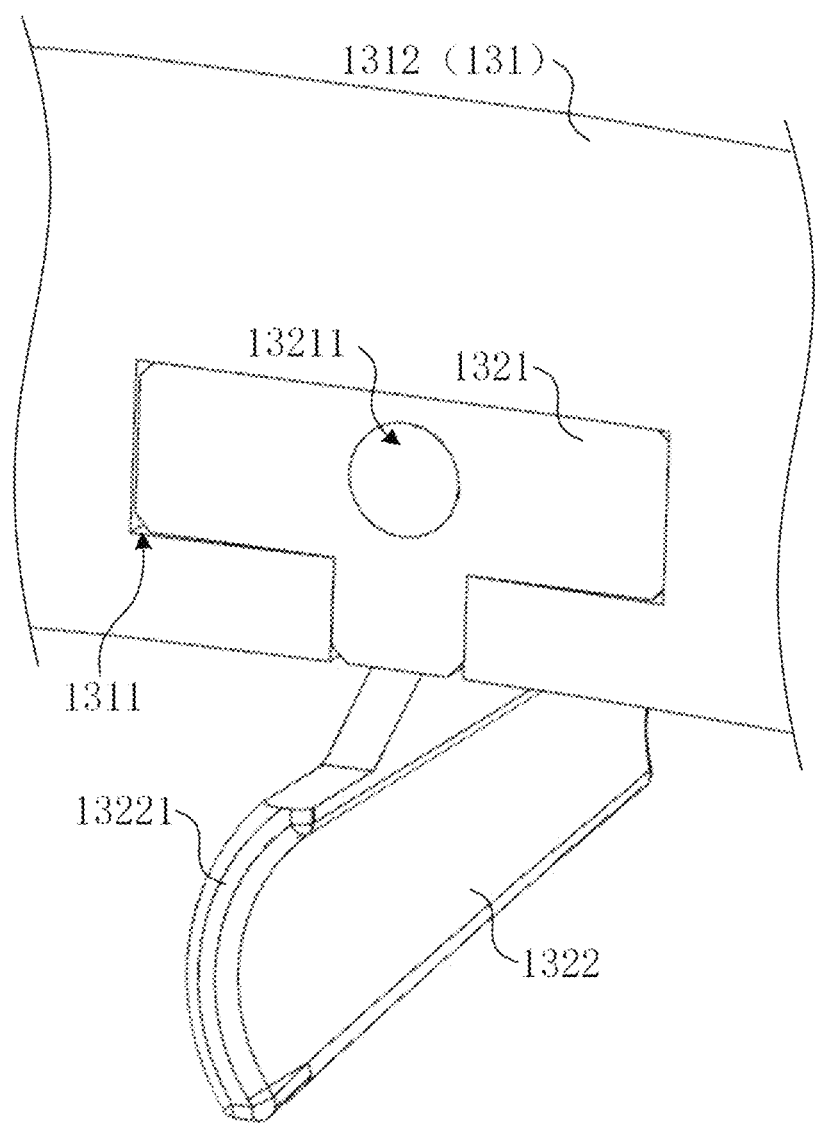
FIG. 5 is a partial perspective view of a connection between a connecting block and a mounting groove.
Figure 6:
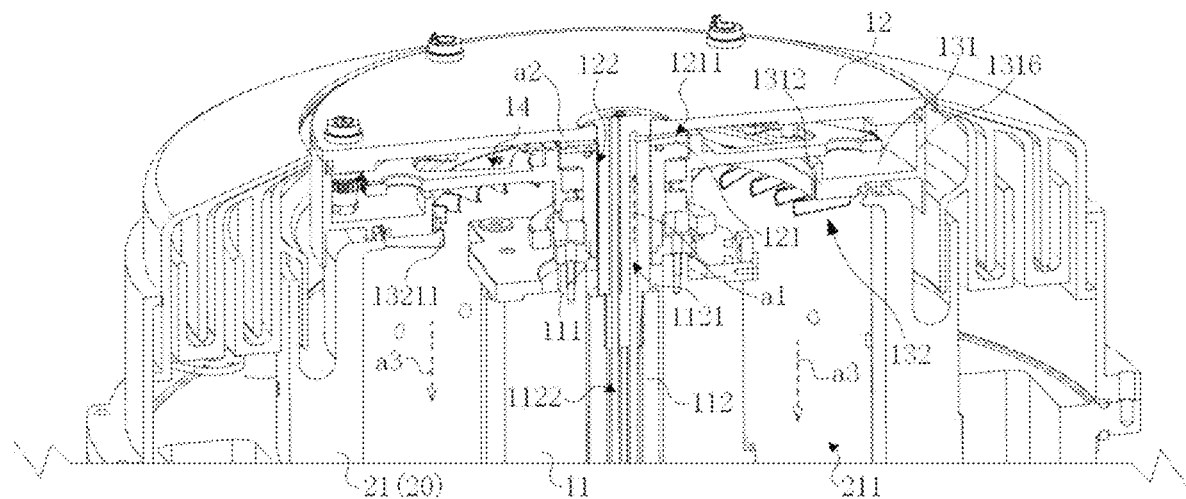
FIG. 6 is a partial perspective view of a connection between an annular assembly base and the positioning plate.
Figure 7:
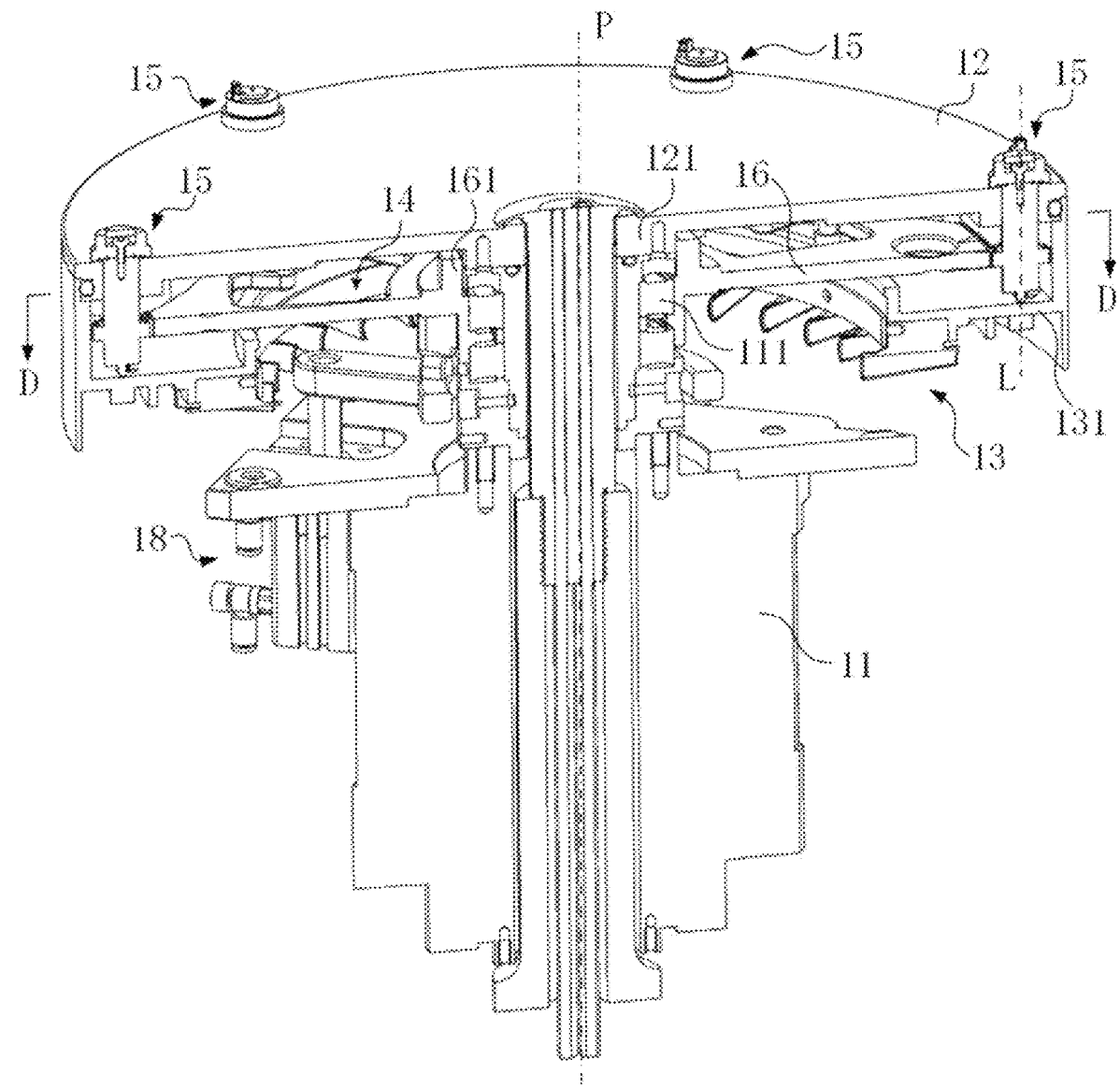
FIG. 7 is a cross-sectional perspective view of a connection between a driving unit and the positioning plate.

Referring to FIGS. 4-6, the wind blade units 132 include connecting blocks 1321, wind blade parts 1322 integrally formed are disposed at bottoms of the connecting blocks 1321. The annular assembly base 131 is configured with mounting grooves 1311 conformed to outer contours of the connecting blocks 1321, and the connecting block 1321 is movably embedded in the mounting groove 1311, exposing the wind blade parts 1322 in the accommodating chamber 211. In this embodiment, a longitudinal cross-sectional shape of the connecting block 1321 paralleling to the axis P is preferably in a shape of a "T" (as shown in FIG. 5), but it can also be in a shape of a "Y" (not shown) or a "+" (not shown), as long as it allows the connecting block 1321 to be movably embedded into the mounting groove 1311 and exposes the wind blade parts 1322 within the accommodating chamber 211. The connecting block 1321 is movably connected to an interior of the mounting groove 1311, facilitating the removal and mounting of the wind blade units 132 for easy maintenance or replacement. In practical use, the amount of air output from the wind blade units 132 can be controlled by adjusting the number of wind blade units 132. Illustratively, the more wind blade units 132 there are, the greater the amount of air delivered into the accommodating chamber 211 during the rotation of the wind blade units 132. Conversely, the fewer the wind blade units 132, the smaller the amount of air delivered into the accommodating chamber 211. By exposing the wind blade parts 1322 within the accommodating chamber 211, the wind blade units 132, when rotating, propels the gas to flow axially downwards (in the direction indicated by arrow a3 in FIG. 3) within the accommodating chamber 211, generating an axially downward wind pressure within the accommodating chamber 211. This prevents exhaust gases from escaping upwards from the accommodating chamber 211 and avoids the diffusion of exhaust gases towards the location of the wafer, and prevents contamination of the wafer, the annular assembly base 131, the positioning plate 12, and other components.

Specifically, referring to FIGS. 3, 6 and 8, the driving unit 11 is arranged in the accommodating chamber 211, and the driving unit 11 includes: a rear spray pipe 112 axially penetrating inner sides of the positioning plate 12 and the hollow drive shaft 111. A gas collection chamber 122 is enclosed and formed between the positioning plate 12 and the rear spray pipe 112, the rear spray pipe 112 is configured with a gas transmission channel 1121 connected to the gas collection chamber 122 and delivering the gas to the gas collection chamber 122, the positioning plate 12 is configured with a plurality of platform through-holes 1211 connected to the gas collection chamber 122 to deliver the gas in the gas collection chamber 122 to an wind supply chamber 14 enclosed and formed by the positioning plate 12 and the annular assembly base 131 by the platform through-holes 1211, and gas in the wind supply chamber 14 is driven by a rotation of the wind blade units 132 to be delivered axially downwards into the accommodating chamber 211. During the rotation of the wafer driven by the positioning plate 12, the gas (such as nitrogen) is delivered by the rear spray pipe 112 through the gas transmission channel 1121 into the gas collection chamber 122 in the direction indicated by arrow a1 in FIG. 6. Then the gas in the gas collection chamber 122 is transported through the platform through-holes 1211 into the wind supply chamber 14 in the direction indicated by arrow a2 in FIG. 6. Continuous gas delivery through the gas transmission channel 1121 into the gas collection chamber 122 allows the gas to diffuse within the wind supply chamber 14. In conjunction with the rotation of the wind blade units 132, the gas within the wind supply chamber 14 is directed axially downwards into the accommodating chamber 211. The exhaust gas is driven by this gas flow within the accommodating chamber 211 to flow downwards (in the direction indicated by arrow a3 in FIG. 6). Therefore, this further prevents the exhaust gas from surging out of the accommodating chamber 211 and avoids the exhaust gas from diffusing towards the location of the wafer, thereby avoiding contaminating the wafer, the annular assembly base 131, the positioning plate 12, and other components. Additionally, by delivering gas through the gas transmission channel 1121 into the wind supply chamber 14 above the wind blade units 132, it can replenish the air above the wind blade units 132, and prevent generation of vortices and turbulence during the wind blade units 132 pushing the gas to flow axially downwards within the accommodating chamber 211.

In this embodiment, referring to FIGS. 6 and 8, the rear spray pipe 112 is configured with a plurality of liquid spraying channels 1122 along the longitudinal direction, and the rear spray pipe 112 axially penetrates through the positioning plate 12 and protrudes upwards from a center of the positioning plate 12. Different liquid spraying channels 1122 are used to spray the same or different cleaning solutions for cleaning a back side of the wafer.

Referring to FIGS. 5-6, the wind blade parts 1322 form wind guiding ends 13221 extending inward in a radial direction through an inner edge of the annular assembly base 131, and the gas in the wind supply chamber 14 is delivered downward into the accommodating chamber 211 in the axial direction through the wind guiding ends 13221 when the wind blade units 132 rotate. The wind guiding end 13221 is formed at least partially at a connection between the wind supply chamber 14 and the accommodating chamber 211. During the rotation of the wind blade units 132, the gas from the wind supply chamber 14 is drawn and introduced by the wind guiding end 13221 to underneath the wind blade parts 1322. As a result, the gas flows axially downward (in the direction indicated by arrow a3 in FIG. 6) and is delivered into the accommodating chamber 211, preventing the exhaust gases from rising out of the accommodating chamber 211 and avoiding contamination of the wafer, the annular assembly base 131, the positioning plate 12, and other components.

Further, referring to FIGS. 4-6, the annular assembly base 131 protrudes inwardly in the radial direction towards the accommodating chamber 211 to form a mounting part 1312, and the mounting groove 1311 is constructed by the mounting part 1312. Preferably, plurality of wind blade units 132 are annularly arranged at equal intervals on the mounting part 1312. The wind pressure component 13 further includes: limiting rings 133 radially abutted against inner side ends of the connecting blocks 1321, and a plurality of first locking components 134 penetrating through the limiting ring 133 and extending at least partially into the connecting block 1321 or the mounting part 1312. Locating holes 13211 for threadedly connecting to the first locking components 134 is disposed on the connecting blocks 1321. After the connecting block 1321 is mounted into the mounting groove 1311, the limiting ring 133 is used to abut against an inner side end of the connecting block 1321 in the radial direction, and partially fit to an inner edge of the mounting part 1312. The first locking component 134 (such as bolt) penetrates through the limiting ring 133 and extends into the connecting block 1321 or the mounting part 1312. By threadedly connecting the first locking component 134 to the limiting ring 133 and the mounting part 1312 or the connecting block 1321, the mounting and fixation of the connecting block 1321 and the limiting ring 133 is achieved, and rotating stability of the wind blade units 132 is improved.

Further, referring to FIGS. 1, 13, 14 and 18, the semiconductor processing equipment 100 further includes a housing 80 and at least two sets of gas-liquid spraying mechanisms 40 formed on a circumferentially outer side of the chamber body mechanism 20 and arranged inside the housing 80. The gas-liquid spraying mechanisms 40 are used to spray cleaning solution, pure water, or nitrogen onto the surface of the wafer in different cleaning modes. The gas-liquid spraying mechanisms 40 include first cylinder bodies 41 and second cylinder bodies 42 sleeved on inside and outside, spray pipes 43 penetrating through the first cylinder bodies 41 and fixedly arranged on the second cylinder bodies 42, and adjusting mechanisms 44 that drive the second cylinder bodies 42 to move longitudinally relative to the first cylinder bodies 41 to adjust height of the spray pipes 43. The second cylinder body 42 is driven by the adjusting mechanism 44 to perform longitudinal movement relative to the first cylinder body 41, allowing for adjustment of the height of the spray pipe 43 according to thickness of the wafer and different process requirements in practical use, including raising or lowering by 2 mm, 5 mm, etc.

Figure 13:
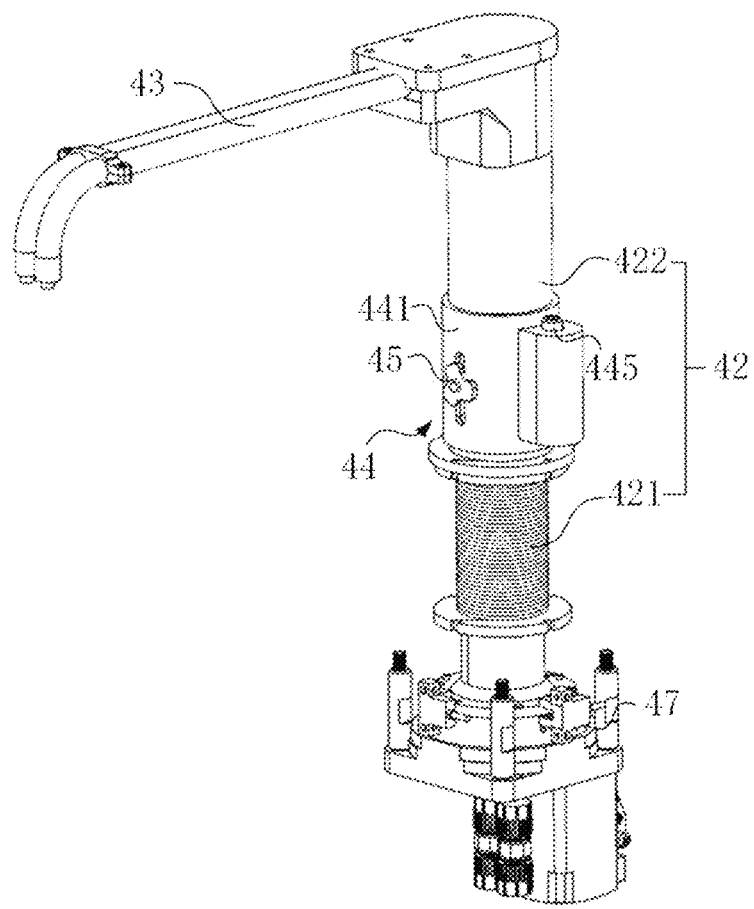
FIG. 13 is a perspective view of a connection between a spray pipe and a second cylinder body.
Figure 14:
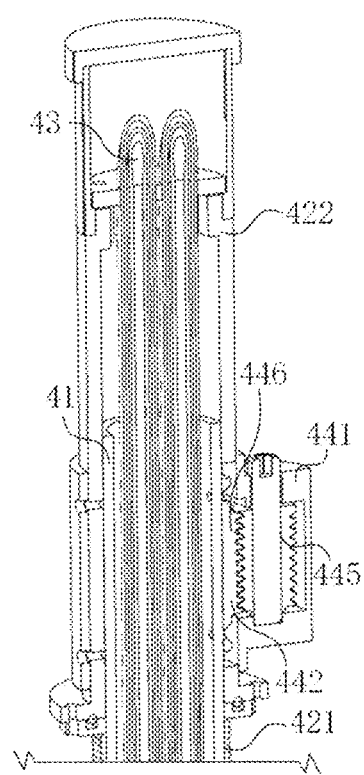
FIG. 14 is a cross-sectional perspective view of a connection between a threaded rod and a fixing pipe.
Figure 15:
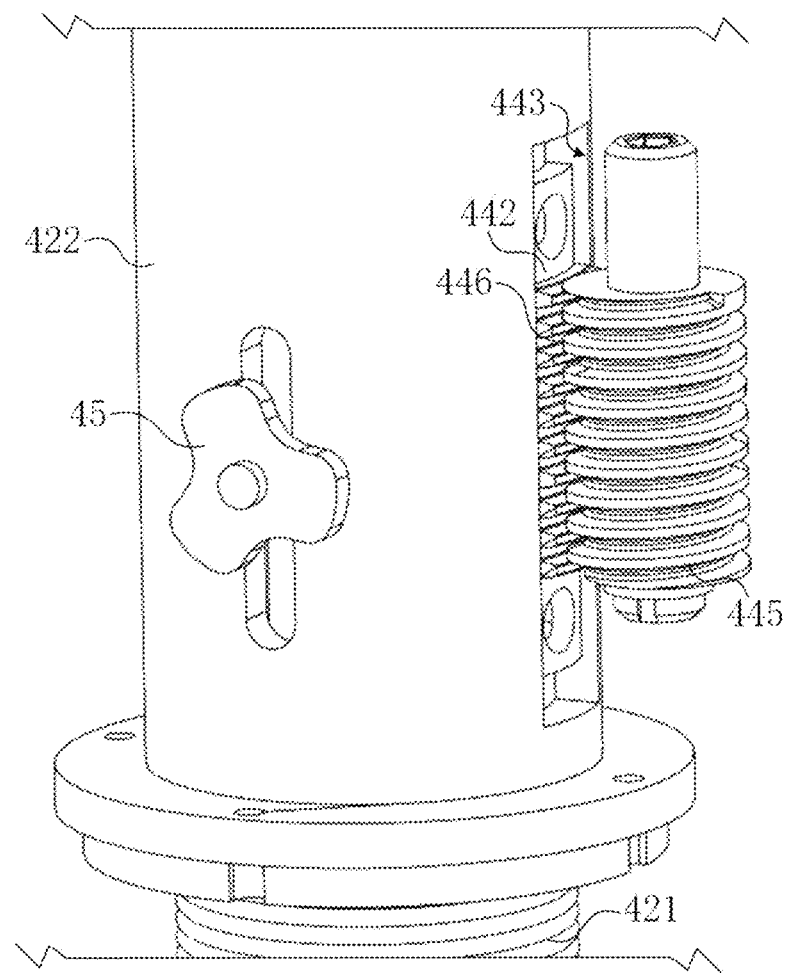
FIG. 15 is a perspective view of the connection between the threaded rod and a threaded rack, where the fixing pipe is omitted.
Figure 16:
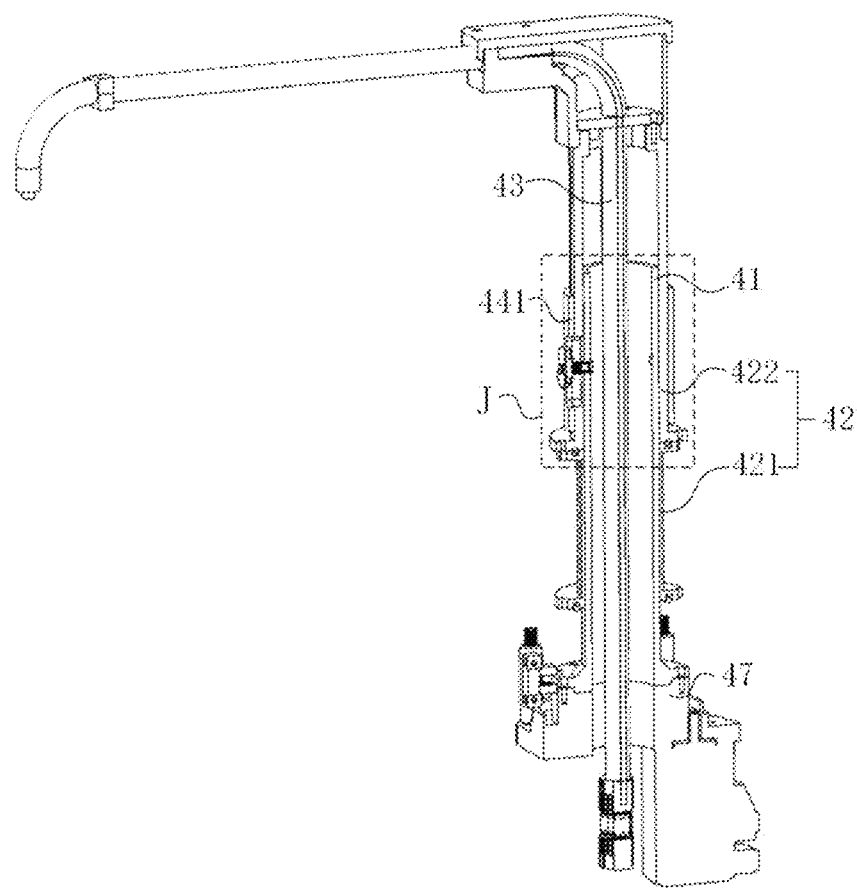
FIG. 16 is a cross-sectional perspective view of a connection between a first cylinder body and the second cylinder body.

Specifically, referring to FIGS. 13-15, the adjusting mechanisms 44 include fixing pipes 441 arranged on outer side walls of the second cylinder bodies 42, guiding grooves 443 longitudinally disposed on walls of the second cylinder bodies 42, guideways 442 arranged on outer side walls of the first cylinder bodies 41 along the longitudinal direction and formed in the guiding grooves 443, and threaded rods 445 arranged in and rotatably connected to the fixing pipes 441. The guideway 442 is configured with threaded racks 446 engaged with the threaded rods 445, and by rotating relative to the fixing pipes 441 and engaging with the threaded racks 446, the threaded rods 445 drive the fixing pipes 441 and the second cylinder bodies 42 to drive the guiding grooves 443 to move longitudinally along the guideways 442, adjusting longitudinal height of the spray pipes 43. By rotating the threaded rod 445, the threaded rod 445 is engaged with the threaded rack 446, driving the fixing pipe 441 and the second cylinder body 42 to drive the guiding groove 443 to move longitudinally along the guideway 442. The spray pipe 43 is simultaneously driven by the second cylinder body 42 to move longitudinally, achieving the adjustment of the longitudinal height position of the spray pipe 43. Additionally, the guideway 442 provides longitudinal guidance and limitation to the guiding groove 443 to prevent the second cylinder body 42 from rotating relative to the first cylinder body 41, ensuring precision of the adjustment of the longitudinal height position of the spray pipe 43. The second cylinder body 42 includes corrugated pipes 421 fixed to the housing 80, and transmission pipes 422 coaxially fixed on the corrugated pipes 421. The fixing pipe 441 is arranged on an outer side wall of the transmission pipe 422 to move simultaneously and longitudinally with the transmission pipe 422 relative to the first cylinder body 41, facilitating expansion and contraction of the corrugated pipe 421 through the transmission pipe 422.

Figure 17:
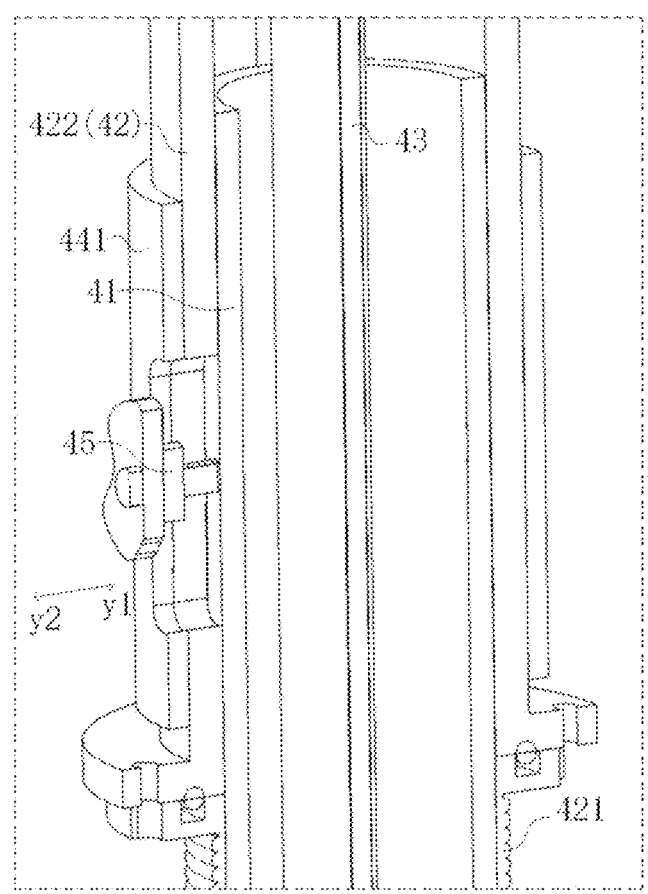
FIG. 17 is an enlarged view of a rectangular frame J shown in FIG. 16.

Further, referring to FIGS. 13, 15 and 17, the adjusting mechanisms 44 further include fourth locking components 45 continuously penetrating through the fixing pipes 441 and the second cylinder bodies 42, and the fourth locking components 45 are adjustable along their own axis to abut against the first cylinder bodies 41 and restrict a longitudinal movement of the second cylinder bodies 42 relative to the first cylinder bodies 41. After the longitudinal height position of the spray pipe 43 has been adjusted, the fourth locking component 45 is rotated and moved in a direction indicated by arrow y1 in FIG. 17. Therefore, the fourth locking component 45 abuts against the outer side wall of the first cylinder body 41. Subsequently, the fixing pipe 441 and the second cylinder body 42 are fixed to the first cylinder body 41, to restrict the second cylinder body 42 from moving longitudinally relative to the first cylinder body 41 and prevent the longitudinal height position of the spray pipe 43 from being altered. When the adjustment of the longitudinal height position of the spray pipe 43 is required, the fourth locking component 45 is rotated and moved in a direction indicated by arrow y2 in FIG. 17 to release the restriction on the fixing pipe 441 and the second cylinder body 42, allowing the second cylinder body 42 to move the spray pipe 43 longitudinally relative to the first cylinder body 41 in order to adjust the longitudinal height position of the spray pipe 43.

Specifically, refer to FIGS. 1 and 13, the gas-liquid spraying mechanisms 40 further include a liquid collection groove 46, and a rotary unit 47 for driving the first cylinder body 41 to drive the spray pipe 43 to rotate between the wafer and the liquid collection groove 46. At the end of the wafer cleaning process, the first cylinder body 41 is rotated by the rotary unit 47 to align an opening of the spray pipe 43 with the liquid collection groove 46. Cleaning solution or pure water overflowing from the spray pipe 43 after the spray pipe 43 has stopped supplying solution into the liquid collection groove 46, avoiding contaminating other components. In one embodiment, the gas-liquid spraying mechanisms 40 further include a pure water-supplementing pipe (not shown) for pre-wetting the wafer surface or performing supplementary cleaning to obtain a wafer that meets high cleanliness requirements. For example, the pure water-supplementing pipe is arranged on an outer side of the chamber body mechanism 20, with an opening of the pure water-supplementing pipe extending above the wafer.

Figure 2:
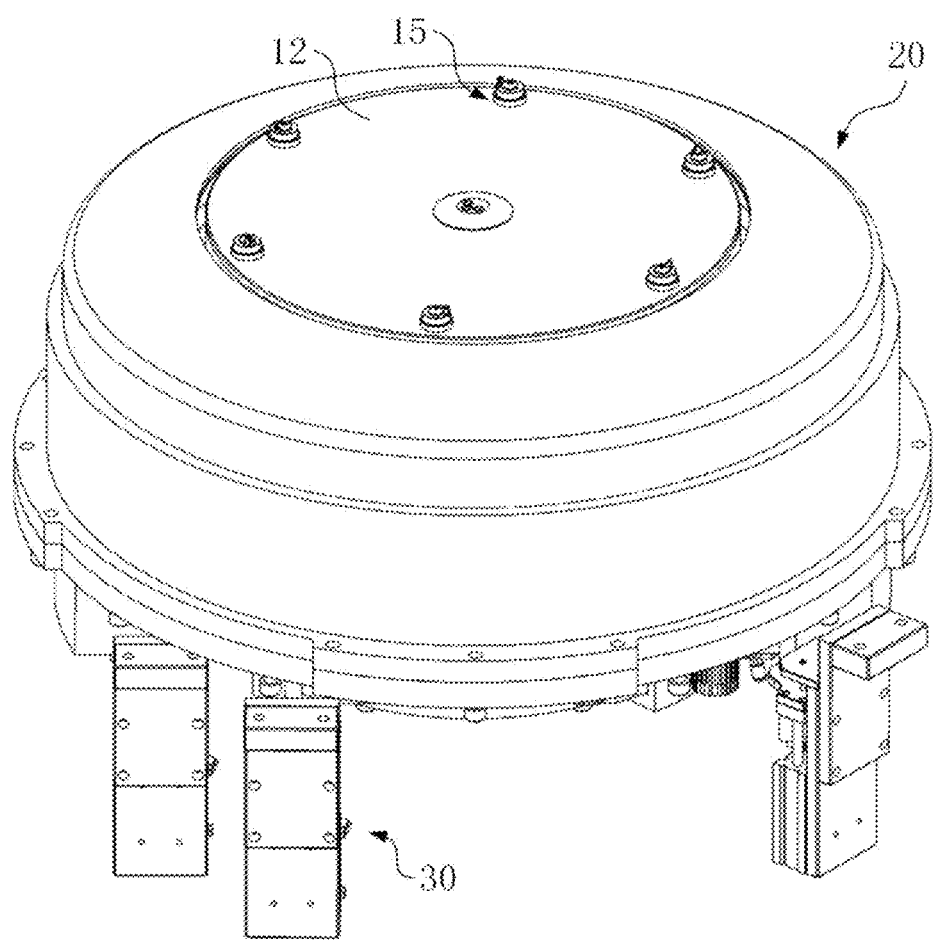
FIG. 2 is a perspective view of a connection between a chamber body mechanism and a positioning plate.

In this embodiment, referring to FIGS. 2 and 3, the chamber body mechanism 20 includes: a chamber body base 21 forming the accommodating chamber 211, and a compound hood structure 22 coaxially arranged on an outer side of the chamber body base 21. The compound hood structure 22 includes: two or more inner hoods stacked inside and outside, and outer hoods 223 coaxially sleeved on the inner hoods. The inner hoods include: a first hood 221 and a second hood 222. A first collection chamber 225 is enclosed and formed between the first hood 221 and the second hood 222, a second collection chamber 226 is enclosed and formed between the second hood 222 and the outer hood 223, and the chamber body base 21 is configured with a third collection chamber 212 formed on an inner side of the first collection chamber 225. The first collection chamber 225, the second collection chamber 226, and the third collection chamber 212 are independent of each other and separately collect cleaning solutions from different cleaning modes to prevent mixing of different cleaning solutions. The semiconductor processing equipment 100 further includes elevating and lowering units 30 driving the inner hoods and the outer hood 223 to perform lifting movements respectively, and by driving the inner hoods and the outer hoods 223 to perform the lifting movements, cleaning solution is collected through the inner hoods and the outer hoods 223 in different cleaning modes.

Referring to FIGS. 1 and 3, an annular enclosing plate 215 formed on an outer side of the outer hood 223 and an exhaust chamber 214 formed on an inner side of the annular enclosing plate 215 are arranged on the chamber body base 21, the first collection chamber 225, the second collection chamber 226, and the third collection chamber 212 are connected to the exhaust chamber 214. The chamber body base 21 is configured with a plurality of gas extraction holes 216 communicated with the accommodating chamber 211 and the exhaust chamber 214, and an exhaust channel 213 communicated with the exhaust chamber 214. The exhaust channel 213 is connected to a gas extraction component 60 included in the semiconductor processing equipment 100. In a process of extracting the exhaust gas from the exhaust chamber 214 through the exhaust channel 213 by the gas extraction component 60, the exhaust gas within the first collection chamber 225, the second collection chamber 226, and the third collection chamber 212 will also be drawn into the exhaust chamber 214 and expelled. The exhaust gas within the accommodating chamber 211 is introduced into the exhaust chamber 214 through the gas extraction holes 216 and expelled. In conjunction with the wind blade units 132 delivering the gas into the accommodating chamber 211, this prevents the exhaust gas within the accommodating chamber 211 from surging upwards in the extracting process through the extraction holes 216, and avoids the exhaust gas from spreading towards the location of the wafer and contaminating the wafer, the annular assembly base 131, the positioning plate 12, and other components.

Referring to FIGS. 1 and 2, the elevating and lowering unit 30 is used to drive the first hood 221 and the second hood 222, and the outer hood 223 to perform lifting movements, respectively. As shown in FIG. 3, the first hood 221 and the second hood 222, and the outer hood 223 are in their initial states. In a process of cleaning the wafer with the first type of cleaning solution, the elevating and lowering unit 30 is used to simultaneously drive the first hood 221, the second hood 222, and the outer hood 223 to move upwards to an upper limit position (this upper limit position state is not shown). Therefore, the first type of the cleaning solution can be splashed by the rotating wafer onto an inner wall of the first hood 221 and an interior of the third collection chamber 212. And droplets of the first type of the cleaning solution splashed onto the inner wall of the first hood 221 will flow into the third collection chamber 212 for collection and recycling. In a process of cleaning the wafer with the second type of cleaning solution, the elevating and lowering unit 30 is used to simultaneously drive the second hood 222 and the outer hood 223 to move upwards to the upper limit position (this upper limit position state is not shown). Therefore, the second type of the cleaning solution can be splashed by the rotating wafer onto an inner wall of the second hood 222 and an interior of the first collection chamber 225. And droplets of the second type of the cleaning solution splashed onto the inner wall of the second hood 222 will flow into the first collection chamber 225 for collection and recycling. In a process of cleaning the wafer with the third type of cleaning solution, the elevating and lowering unit 30 is used to drive the outer hood 223 to move upwards to the upper limit position (this upper limit position state is not shown). Therefore, the third type of the cleaning solution can be splashed by the rotating wafer onto an inner wall of the outer hood 223 and an interior of the second collection chamber 226. And droplets of the third type of the cleaning solution splashed onto the inner wall of the outer hood 223 will flow into the second collection chamber 226 for collection and recycling. Finally, separation and recycling for different cleaning solutions are achieved. Considering that the elevating and lowering unit 30 is not the inventive aspect of the present application, any equipment in the prior art capable of driving the first hood 221, the second hood 222, and the outer hood 223 to move up and down can be utilized, and the detailed description of the elevating and lowering unit 30 is omitted in the examples of the present application.

Figure 18:
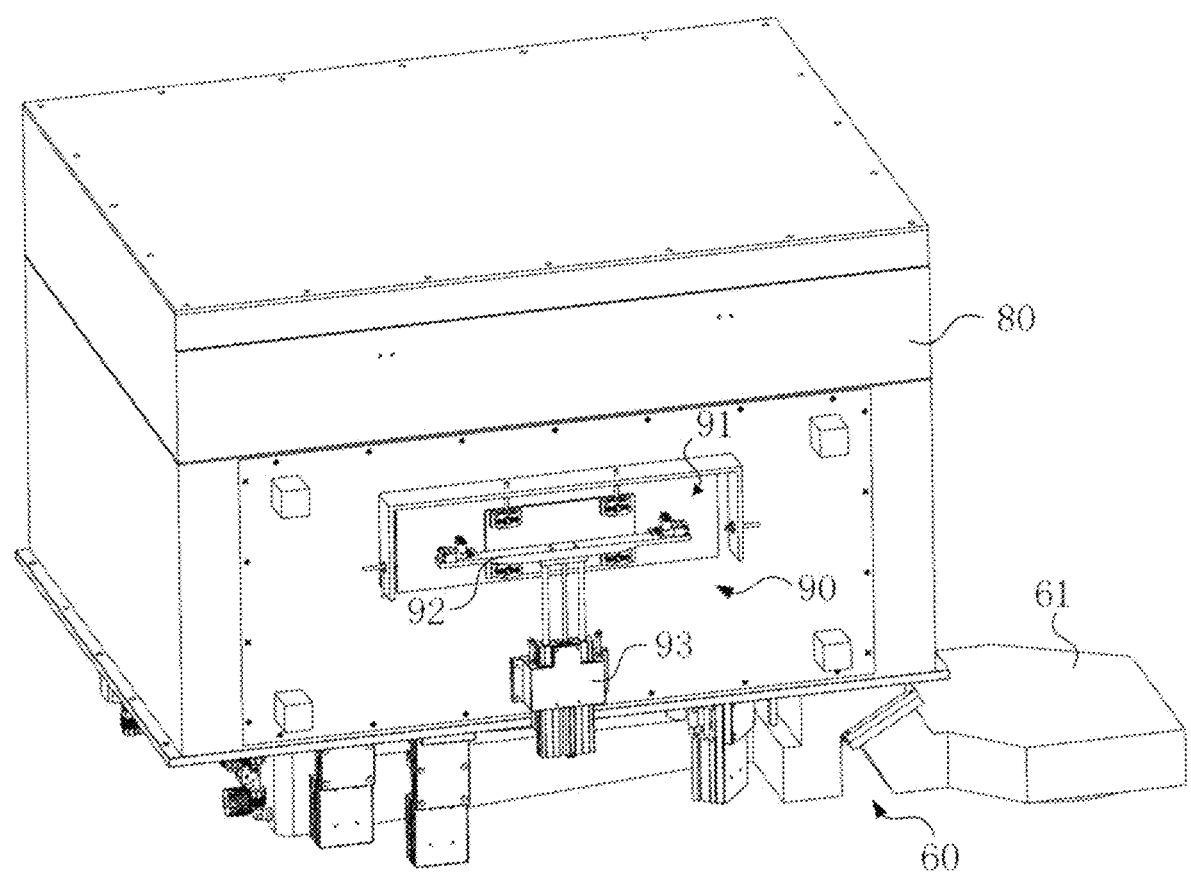
FIG. 18 is a perspective view of a connection between a housing and a wafer transfer component.

Referring to FIGS. 1 and 18, the semiconductor processing equipment 100 further includes: a fan filter component 50 formed above the chamber body mechanism 20 and arranged on the housing 80, a gas extraction component 60 connected to the chamber body mechanism 20 and arranged at a bottom of the housing 80, a wafer transfer component 90 arranged on a side wall of the housing 80, and an imaging equipment (not shown) and a light sensing equipment (not shown) arranged in the housing 80. The gas extraction component 60 includes a gas extraction pipe 61 and an air pump (not shown) connected to the gas extraction pipe 61, and the gas extraction pipe 61 is connected to the exhaust channel 213 to extract the exhausted gas in the chamber body mechanism 20. The air is filtered by the fan filter component 50 and introduced into the chamber body mechanism 20. The imaging equipment is used to monitor the flow of liquid sprayed by the gas-liquid spraying mechanisms 40 and the status of the gas-liquid spraying mechanisms 40. The light sensing equipment serves for fire safety monitoring to monitor whether there is a fire inside the semiconductor processing equipment 100.

Referring to FIGS. 1 and 18, in some embodiments, the wafer transfer component 90 includes a wafer transfer port 91 disposed at a side portion of the housing 80, a baffle 92 arranged on an outer side of the wafer transfer port 91, an air cylinder 93 connected below the baffle 92, and an electrostatic eliminator (not shown) arranged towards the wafer transfer port 91. Opening and closing of the wafer transfer port 91 are controlled by moving the baffle 92 up and down through the cylinder 93. The electrostatic eliminator is arranged above the wafer transfer port 91 to remove static electricity on the surface of the wafer before and after cleaning and prevent electrostatic adsorption of fine contaminants.

The series of detailed descriptions listed above are merely specific explanations of feasible embodiments of the present disclosure, and they are not intended to limit the scope of protection of the present disclosure. Any equivalent embodiments or modifications made without departing from the spirit of technology of the present disclosure are included within the scope of protection of the present disclosure.

It is apparent to those skilled in the art that the present disclosure is not limited to the details of the above-described exemplary examples, and that the present disclosure can be embodied in other specific forms without departing from the spirit or essential features of the present disclosure. Therefore, from any perspective, the examples are regarded as exemplary and non-limiting. The scope of the present disclosure is defined by the appended claims rather than the above description. It is intended to encompass all variations that fall within the meaning and scope of the equivalent elements of the claims. No reference signs in the claims are to be construed as limiting the claims to which they are referred.

In addition, it is to be understood that although the specification is described in accordance with the examples, not each example includes only one independent technical solution. This description of the specification is for the sake of clarity only, and those skilled in the art are to regard the specification as a whole, and the technical solutions in each example may be appropriately combined to form other embodiments that can be understood by those skilled in the art.

The invention claimed is:

1. A semiconductor processing equipment, comprising:
a positioning plate, three clamping column units or more longitudinally penetrating through and rotatably connected to the positioning plate, and a control component driving a plurality of the clamping column units to rotate to clamp or release a wafer, wherein
each of the clamping column unit comprises: an axial center part, a clamping part arranged at top ends of the axial center part, a first sealing ring arranged around outer sides of the axial center part and clamped between the clamping part and the positioning plate, at least two sets of first connecting rods with an equal spacing formed by protruding from ends of the axial center part passing through the positioning plate, and a first elastic component connected to the first connecting rods;
an annular assembly base is axially arranged on an inner side of the positioning plate, and the annular assembly base is configured with second connecting rods longitudinally corresponding to positions of the first connecting rods; two ends of the first elastic component are respectively connected to the first connecting rod and the second connecting rod, to maintain the first elastic component in an initial tensile state, and the first elastic component exerts a longitudinally downward elastic force on the clamping part to clamp the first sealing ring between the clamping part and the positioning plate; and
the clamping column units are configured to switch from a state of clamping the wafer to a state of not clamping the wafer, wherein during the switching, the first connecting rods are simultaneously driven by the axial center part, and the first elastic component is further stretched from the initial tensile state.

2. The semiconductor processing equipment according to claim 1, wherein during the switching, the first connecting rods are simultaneously driven by the axial center part, and the further stretched first elastic component contract and return to the initial tensile state.

3. The semiconductor processing equipment according to claim 1, wherein the axial center part protrudes longitudinally downward to form an anti-deviation protrusion part, the annular assembly base is configured with anti-deviation grooves for being inserted by at least parts of the anti-deviation protrusion part, and the anti-deviation groove is rotatably engaged with the anti-deviation protrusion part.

4. The semiconductor processing equipment according to claim 1, further comprising: a driving unit for driving the positioning plate to rotate in an axial direction, and a hollow drive shaft coaxially fixed to the positioning plate formed by the driving unit, wherein
the control component comprises: a transmission plate coaxially sleeved on the hollow drive shaft, the transmission plate being rotatably connected to the hollow drive shaft and driving the clamping column units to rotate around their own axis, a plurality of holding components for driving the transmission plate to rotate in a first direction, and a release component formed on a longitudinal inner side of the transmission plate and driving the transmission plate to rotate in a second direction opposite to the first direction; and
the transmission plate rotates in the first direction relative to the positioning plate in a stationary state to drive the clamping column units to switch from the state of not clamping the wafer to the state of clamping the wafer, and the transmission plate rotates in the second direction relative to the positioning plate in the stationary state to drive the clamping column units to switch from the state of clamping the wafer to the state of not clamping the wafer.

5. The semiconductor processing equipment according to claim 4, wherein an end of the axial center part close to the first connecting rods are configured with a gear actuating part, and the gear actuating part mesh with a gear block part formed at an outer peripheral edge of the transmission plate; and
the gear block part is simultaneously driven by a rotation of the transmission plate to rotate circumferentially around the axial direction, and the gear block part meshes with the gear actuating part to drive the clamping column units to rotate around their own axis in mounting holes disposed on the positioning plate to ensure that the clamping part clamps or releases the wafer.

6. The semiconductor processing equipment according to claim 5, wherein the second connecting rods are arranged at one side of a bottom of the annular assembly base opposite to the clamping column units, the annular assembly base is configured with fool-proofing grooves for the first elastic component to penetrate through, the two ends of the first elastic component are respectively connected to ends of the first connecting rods and the second connecting rods extending through the gear actuating parts, and the first elastic component rotates with a rotation of the first connecting rod and stretches in the fool-proofing groove.

7. The semiconductor processing equipment according to claim 4, wherein the positioning plate protrudes downward in the axial direction to form a protruding part coaxially fixed to the hollow drive shaft, the transmission plate protrudes upward in the axial direction to form a transmission part arranged around an outer side of the protruding part, the transmission part is configured with a plurality of space-keeping grooves, and the protruding part protrudes outward in a radial direction to form protruding blocks extending into the space-keeping grooves; and
the holding components drive the transmission plate to rotate in the first direction to drive walls of the space-keeping grooves to abut against the protruding blocks, and drive the clamping column units to clamp the wafer; and the hollow drive shaft drives the positioning plate to rotate in the second direction, and the positioning plate drives the protruding blocks to rotate simultaneously to achieve the rotation of the transmission plate at the same speed as the positioning plate by using the protruding blocks to pull the walls of the space-keeping grooves.

8. The semiconductor processing equipment according to claim 7, wherein each of the holding components comprises: first connecting columns arranged on the positioning plate, second connecting columns arranged on the transmission plate, and second elastic components with their two ends respectively connected to the first connecting columns and the second connecting columns; and the second elastic components exert an elastic force on the second connecting columns to drive the transmission plate to rotate in the first direction relative to the positioning plate, driving the clamping column units to switch from the state of not clamping the wafer to the state of clamping the wafer.

9. The semiconductor processing equipment according to claim 7, wherein the transmission plate protrudes downward in the axial direction to form a transmission ring, and one side of the transmission ring facing the release component is concavely arranged to form an angled guiding surface relative to a horizontal plane on which the transmission plate is arranged;

the release component comprises: a lifting unit, a connecting ring formed on an outer side of the hollow drive shaft and controlled by the lifting unit to perform lifting and lowering movement in the axial direction, and a guiding component arranged on the connecting ring and facing the guiding surface; and the lifting unit is configured to drive the connecting ring to drive the guiding component to move upward in the axial direction, wherein during the driving, the guiding component is in contact with the guiding surface to drive the transmission ring to rotate in the axial direction, and the transmission plate rotates in the second direction relative to the positioning plate in a passive manner, driving the clamping column units to switch from the state of clamping the wafer to the state of not clamping the wafer.

10. The semiconductor processing equipment according to claim 7, further comprising: a chamber body mechanism circumferentially arranged around outer sides of the positioning plate and the driving unit and formed with an accommodating chamber, and a wind pressure component arranged on the inner side of the positioning plate along the axial direction, wherein the wind pressure component comprises: the annular assembly base fixed coaxially to the positioning plate, and a plurality of wind blade units annularly arranged on the annular assembly base and formed in the accommodating chamber; and the annular assembly base rotates along with a rotation of the positioning plate, driving the wind blade units to rotate around an axis of the positioning plate and push gas to flow downward in the axial direction in the accommodating chamber.

11. The semiconductor processing equipment according to claim 10, wherein the wind blade units comprise: connecting blocks, and wind blade parts integrally formed are disposed at bottoms of the connecting blocks; and the annular assembly base is configured with mounting grooves conformed to outer contours of the connecting blocks, and the connecting block is movably embedded in the mounting groove, exposing the wind blade parts in the accommodating chamber.

12. The semiconductor processing equipment according to claim 11, wherein the driving unit is arranged in the accommodating chamber, and the driving unit comprises: a rear spray pipe axially penetrating through inner sides of the positioning plate and the hollow drive shaft; and a gas collection chamber is enclosed and formed between the positioning plate and the rear spray pipe, the rear spray pipe is configured with a gas transmission channel connected to the gas collection chamber and delivering the gas to the gas collection chamber, the positioning plate is configured with a plurality of platform through-holes connected to the gas collection chamber, allowing for delivering the gas in the gas collection chamber to a wind supply chamber enclosed and formed by the positioning plate and the annular assembly base through the platform through-holes, and gas in the wind supply chamber is driven by a rotation of the wind blade units to be delivered axially downwards into the accommodating chamber.

13. The semiconductor processing equipment according to claim 12, wherein wind guiding ends extending inward in a radial direction through an inner edge of the annular assembly base are formed on the wind blade parts, and the gas in the wind supply chamber is delivered downward into the accommodating chamber in the axial direction through the wind guiding ends when the wind blade units rotate.

14. The semiconductor processing equipment according to claim 13, wherein the wind pressure component further comprises: limiting rings radially abutted against inner side ends of the connecting blocks, and a plurality of first locking components penetrating through the limiting rings and extending at least partially into the connecting blocks or the annular assembly base.

15. The semiconductor processing equipment according to claim 10, further comprising: a housing and at least two sets of gas-liquid spraying mechanisms formed on a circumferentially outer side of the chamber body mechanism and arranged inside the housing, wherein the gas-liquid spraying mechanisms comprise: first cylinder bodies and second cylinder bodies sleeved inside and outside, spray pipes penetrating through the first cylinder bodies and fixedly arranged on the second cylinder bodies, and adjusting mechanisms that drive the second cylinder bodies to move longitudinally relative to the first cylinder bodies to adjust height of the spray pipes;

the adjusting mechanisms comprise: fixing pipes arranged on outer side walls of the second cylinder bodies, guiding grooves longitudinally disposed on walls of the second cylinder bodies, guideways arranged on outer side walls of the first cylinder bodies along the longitudinal direction and formed in the guiding grooves, and threaded rods arranged in and rotatably connected to the fixing pipes; and the guideways are configured with threaded racks engaged with the threaded rods, and by rotating relative to the fixing pipes and engaging with the threaded racks, the threaded rods drive the fixing pipes and the second cylinder bodies to drive the guiding grooves to move longitudinally along the guideways, adjusting longitudinal height of the spray pipes.

16. The semiconductor processing equipment according to claim 15, wherein the adjusting mechanisms further comprise: second locking components continuously penetrating through the fixing pipes and the second cylinder bodies, and the second locking components are adjustable along their own axis to abut against the first cylinder bodies and restrict a longitudinal movement of the second cylinder bodies relative to the first cylinder bodies.

17. The semiconductor processing equipment according to claim 15, wherein the chamber body mechanism comprises: a chamber body base forming the accommodating chamber, and a compound hood structure coaxially arranged on an outer side of the chamber body base; and the compound hood structure comprises: two or more inner hoods stacked inside and outside, and outer hoods coaxially sleeved on the inner hoods; and the semiconductor processing equipment further comprises elevating and lowering units driving the inner hoods and the outer hoods to perform lifting movements respectively, and by driving the inner hoods and the outer hoods to perform the lifting movements, cleaning solution is collected through the inner hoods and the outer hoods in different cleaning modes.

18. The semiconductor processing equipment according to claim 15, further comprising: a fan filter component formed above the chamber body mechanism and arranged on the housing, a gas extraction component connected to the chamber body mechanism and arranged at a bottom of the housing, a wafer transfer component arranged on a side wall of the housing, and an imaging equipment and a light sensing equipment arranged in the housing, wherein the wafer transfer component comprises: a wafer transfer port disposed at a side portion of the housing, a baffle arranged on an outer side of the wafer transfer port, an air cylinder connected below the baffle, and an electrostatic eliminator arranged towards the wafer transfer port.

* * * * *